United States Patent [19]

Campbell et al.

[11] Patent Number: 5,611,024
[45] Date of Patent: Mar. 11, 1997

[54] DATA COMPRESSION OF BIT MAP IMAGES

[75] Inventors: Scott O. Campbell, Spring; Greg Adams, Tomball; Jeffrey M. Braaten, Houston, all of Tex.

[73] Assignee: Compaq Computer Corporation, Houston, Tex.

[21] Appl. No.: 937,504

[22] Filed: Aug. 28, 1992

[51] Int. Cl.⁶ .................................................. G06F 15/00
[52] U.S. Cl. ........................................ 395/114; 395/115
[58] Field of Search ........................... 395/114–116, 112, 395/101; 358/426, 261.1, 261.2, 261.3, 261.4, 444, 427, 430, 432, 433; 341/107, 87, 51, 67; 382/232

[56] References Cited

U.S. PATENT DOCUMENTS

| | | | |
|---|---|---|---|
| 4,631,597 | 12/1986 | Ogawa ................................. | 358/258 |
| 4,791,680 | 12/1988 | Yokoe et al. ......................... | 382/56 |
| 4,881,180 | 11/1989 | Nishiyama .......................... | 364/518 |
| 5,047,955 | 9/1991 | Shope et al. ......................... | 364/519 |
| 5,109,476 | 4/1992 | Thompson ........................... | 395/105 |
| 5,295,238 | 3/1994 | Dickson ............................... | 395/150 |

FOREIGN PATENT DOCUMENTS 0510923  4/1992  European Pat. Off. .

OTHER PUBLICATIONS

Welch, T.A., "A Technique for High–Performance Data Compression." *iEEE Computer*, (Jun. 1984), pp. 8–19.

Williams, R.N., "An Extremely Fast ZIV–Lempel Data Compression Algorithm." *DCC '91—Data Compression Conference*, (Storer & Reif, eds., 1991), pp. 362–371.

Knuth, D.E., "Sorting & Searching", *The Art of Computer Programming*, vol. 3, Addison–Wesley, 1973, pp. 506–542.

*Primary Examiner*—Edward L. Coles, Sr.
*Assistant Examiner*—Dov Popovici
*Attorney, Agent, or Firm*—Pravel, Hewitt, Kimball & Krieger

[57] ABSTRACT

A method and apparatus for storing compressed bit map images in a laser printer. Bit map images representing a page of data are divided into bands and compressed into the printer memory. Then, when needed by the interpreter/rasterizer, they are decompressed into another portion of that memory, or when desired to print those bands they are directly transmitted to a decompression engine. The bands of bit map image are compressed using a Lempel-Ziv algorithm that contains improvements allowing compression towards the end of the band and improves the compression speed at the beginning of the band by initializing a hash table. Further, the interpreter/rasterizer switches between compression routines depending on the available memory and the desired speed of compression. The compression routine requests supplemental destination buffers when it needs additional memory in which to compress data. Finally, the compression continues to add margin white space during the compression of the uncompressed bit images so that margin what space need not be stored in the uncompressed bit image.

7 Claims, 12 Drawing Sheets

DATA COMPRESSION OF BIT MAP IMAGES

BACKGROUND OF THE INVENTION

1. Field of the Invention

This invention pertains to computer data compression technology and computer printer technology. More specifically, this invention pertains to the addition of margin white space to and then compression of bit map images in a printer, and storing the compressed images in bands of memory for later use by the printer.

2. Description of the Related Art

Technology associated with printers and printing has ridden the tide of the rapid advances of computer technology in general. From the days of the daisy wheel and the nine pin dot matrix printers, we have now come to an era of affordable laser, ink jet, and even color high resolution printing. As the resolutions and corresponding print qualities have risen dramatically, so have the amounts of memory required to drive these printers. Multi-megabyte memory configurations are becoming more common as the resolutions rise.

For example, in monochrome laser printing an image is typically rendered at 300 dots per inch, requiring nearly one megabyte of random access memory for a letter size page. This same image rendered at 600 dots per inch results in a four-fold increase in the required memory, or approximately four megabytes. Higher resolution is not the only cause of increasing memory demands. Color or gray scale images typically require 2 to 32 bits of information for each pixel of the rendered bit image. A letter sized image rendered at 600 dots per inch using 32 bits of color information would require not four megabytes of memory but rather 128 megabytes of memory. The cost of more memory is passed to the consumer either in the initial price of the product or as the cost of an optional memory upgrade.

One development in the field of high resolution printing has involved the transmission of images from the host computer to the printer itself. The transmission of an entire page in a discrete bit image, or rasterized, format created two serious problems as resolutions rose. First, the printer and the host computer were often linked by a relatively slow serial data path, and the transmission of an entire page in rasterized, or bit image, form could lead to unacceptably slow transmission times because of this bottleneck. Second, as resolutions increased and more memory was required to hold an entire rasterized page, it became inefficient to generate that rasterized page in the memory of the host computer itself. Many host computers did not even contain one megabyte of memory, and as that is the amount of memory typically needed for a letter size page, such rasterization was not feasible.

Partially in response to these problems, page description languages were developed. Page description languages describe pages as a group of graphical and textural objects rather than as bit images. For example, a circle might be represented by a data structure giving a center location and a radius. This object oriented approach can lead to far more efficient representation of graphical and textual data. The memory needed to store a bit image is a function of the page size, pixel density, and number of bits of information per pixel. Memory requirements for a set of page description language commands describing a page, on the other hand, are typically proportional to the complexity of the page itself. A very simple page requires few commands and correspondingly little memory to store, while a more complex page requires more memory. For all but the most complex pages, the amount of memory required to store the associated page description language commands is typically less than the amount required to store the corresponding rasterized page image.

The lower memory requirements led to shorter transmission times to the printer. Page description languages also facilitated page generation "on the fly" rather than storing all of the page at one time. This in turn required less memory usage by the host computer. Once the command to generate a circle had been sent, for example, it need not be stored in the host computer memory but could instead be discarded.

An application program can easily create page description language output as all it need do is generate the required "commands" in that language. Then, that page description language text is transmitted to the printer, where an interpreter/rasterizer interprets the codes of the page description language text and rasterizes the page represented by those codes into a bit image. In other words, the interpreter/rasterizer translates the page description language codes into a bit image of the page. That bit image is then stored in the printer memory rather than the host computer memory.

Page description languages further allow for a single software interface to be used with a variety of hardware platforms. A printer's resolution may be lower or higher, the page size may be larger or smaller, but this can all be handled in the implementation of the interpreter/rasterizer that converts the page description language code to a bit image. Thus, the host computer need not know the specifics of the hardware that the interpreter/rasterizer drives.

These page description languages are very well known and include Postscript and Postscript Level 2 by Adobe Systems Incorporated and PCL 5. The interpreter/rasterizer is typically run on its own microprocessor; for example, the 68000 series by Motorola, Inc. or the Am29000 series by Advanced Micro Devices, Inc., can execute the programmed interpreter/rasterizer.

In practice, an application program or the system software of a host computer generates the page description language code for a page and then transmits that code to the printer. There, the software in the interpreter/rasterizer interprets the page description language code, converting the code into a bit image for printing by the print engine. The interpreter/rasterizer will have an associated random access memory of arbitrary size for use as storage for the rasterized bit image, for working memory, for storing subsequent pages, for storing font images, or for other typical memory uses of an interpreter/rasterizer. Typically, the rasterized image will be stored in bands, with multiple bands per page, which can be retrieved for transmission to the print engine and discarded when no longer needed.

Some page description languages do provide for compression of the page description language code itself. Before transmission, the code is compressed using one of a number of well known compression algorithms, and then when received by the printer that code is decompressed. This allows for shorter transmission times, as less data is being transmitted to convey the same amount of information.

Data compression techniques are very well known in the computing field. For example, a class of algorithms known as Lempel-Ziv 77, or LZ77, is widely used for adaptive lossless data compression. Another class known as LZ78 is now more commonly used, but the LZ77 class has unique features that make it particularly suitable to some applications. These algorithms are well known in the art, and a good overview is provided in Ross N. Williams, *An Extremely Fast Ziv-Lempel Data Compression Algorithm*, DCC '91

Data Compression Conference 362 (James A. Storer & John H. Reif eds., 1991).

In the past, Lempel-Ziv 77 algorithms have had drawbacks that led to inefficiency. For example, those algorithms typically stopped compressing towards the end of a source block. Further, those algorithms typically did not initialize the hash table they used that pointed to data that had been previously compressed. This caused a loss of speed and efficiency when first compressing the data.

The interpreter/rasterizer's use of its random access memory is one area of printer technology ripe for improvement. While page description languages have been invaluable in the generation and transmission of pages, the interpreter/rasterizer must still generate and store a rasterized image of a page in its own memory. As seen above, the memory requirements for a full rasterized page can be enormous.

Developers have used various techniques to reduce these memory requirements within the printer itself. For example, very high end laser printers use a start/stop technique in which they reduce their memory requirements by printing a small section of the page, stopping the print process while the next section of the page is rasterized into memory, and then restarting the print process, repeating these steps until done. These machines typically print at very high resolutions and are quite complex mechanically. In a technique used by PCL 5, the page description language codes are sequenced such that those commands pertaining to the top of the page are placed in the beginning of the source code file and those pertaining to the bottom of the page are placed at the end. The printer is then started and the printer processor that renders the bit map image a band at a time "races" the print engine, or the part of the printer that does the actual printing, by attempting to interpret the codes and render the image at least as fast as the print engine can print the rendered image. This technique, however, usually fails on complex pages, and the user must install more memory to print anything but very simple images.

One area in which current printers lose efficiency in their use of their internal memories is in the storage of margin white space. Printers typically store the white space representing the left and right margins on a page even when the logical margin is larger than the physical margin required by the print engine. This is in part because of how an interpreter/rasterizer transmits data to the print engine. The print engine typically expects the interpreter/rasterizer to transmit a full scan line of data to the print engine. A scan line is simply the memory representation of one row of the printed bit image. This scan line, however, is physically typically of a fixed number of bits, that number being set by the requirements of the print engine. Logically, however, an interpreter/rasterizer need only store the scan line data up to the beginning of the right margin white space. This follows from the manner in which print engines physically function; when the print engine receives nothing, it leaves the corresponding bit white. Thus, the interpreter/rasterizer can simply send nothing to the print engine at the end of the scan line, and therefor need not store anything.

Interpreters/rasterizers typically include any logical margin white space at the front of each scan line. This logical margin white space, when added to the physical margin necessitated by the print engine, forms the full margin. As each page will have a fixed logical margin, however, storage of this margin white space is very inefficient.

Thus, it would be desirable to improve the efficiency of the memory usage by the interpreter/rasterizer in the printer itself. More specifically, it would be desirable if less memory were required to store a bit image.

SUMMARY OF THE PRESENT INVENTION

A printer built according to this invention is more efficient in using its internal memory, thus allowing the storage of more and larger rasterized images. Such a printer achieves this greater efficiency by actually compressing bit images after receiving page description language codes from a host computer and rasterizing those codes but before storing the rasterized image in the printer memory.

Further, a printer built according to this invention will typically compress this data from bands of a full page's rasterized bit image and then store the compressed bands in the printer memory to be retrieved and decompressed when it is desired to print that band of the page. If the printer's rasterizer/interpreter needs to modify a particular band, it decompresses that compressed band into a working memory, manipulates the data as it needs, and then recompresses that band and again stores it in the printer memory.

When it is desired to print a band of memory, a printer according to this invention transmits the compressed band of memory to a hardware decompression engine, which decompresses the band and transmits the decompressed scan lines to the print engine. This frees up the processor running the rasterizer/interpreter to perform other functions, such as interpreting the next page of page description language code.

Although a number of algorithms can be used to compress the bit images stored in the printer memory, a device according to this invention typically uses a Lempel-Ziv 77 type of algorithm. A printer built according to this invention has improvements in that algorithm that provide even greater efficiency and speed in compressing, decompressing, and storing the rasterized bit image.

One way this higher efficiency is achieved is through initialization of the hash table used by the Lempel-Ziv 77 algorithm in compressing its data. Typically, Lempel-Ziv 77 algorithms do not initialize their hash table, but instead determine the validity of the data pointed to in the hash table during the compression process itself. In the Lempel-Ziv 77 algorithm of a printer built according to the invention, the hash table is first initialized to point to the first element of uncompressed data. This improves the speed of the algorithm in compressing the bit image data.

Further, the Lempel-Ziv 77 algorithm according to the invention is improved in its compression towards the end of a block. Typically, Lempel-Ziv 77 algorithms copy the last portion of the block of data they compress in uncompressed form. This is so because those algorithms typically do not check for the end of the uncompressed block while they are actually compressing portions of the data. In a printer built according to the invention, the Lempel-Ziv 77 algorithm improves compression by reducing the number of bytes of data that can be stored in any one compressed unit when the end of the block is near.

A printer built according to the invention improves its use of memory further by not storing in uncompressed form any left margin data associated with the logical left margin. When compressing the data, the printer then adds any margin white space needed. Thus, the white space is stored only in compressed form. This white space can usually be compressed very efficiently.

A printer built according to this invention further achieves more efficient memory usage by dynamically switching between compression algorithms depending upon the memory-speed trade-off. If memory requirements are tight, then the compression routine uses a form of the Lempel-Ziv 77 algorithm that is slower but has a higher compression ratio. When memory requirements are more relaxed, the printer according to the invention uses a higher speed but less compression efficient form of the Lempel-Ziv 77 algorithm. Further, it inserts flags into the data produced by the compression algorithm to indicate which algorithm should be used in decompressing the data.

The printer according to the invention also saves memory by allowing the use of a destination buffer for its compression algorithm that might not be large enough to hold the compressed bit image. As it is impossible to know beforehand the ultimate size of a compressed image one would have to provide extra destination space to prevent an error. In a printer according to this invention, however, if the compression algorithm exhausts its destination block space while compressing an uncompressed band of bit image, it simply requests more memory space from the interpreter/rasterizer. It calculates the size of this needed memory based upon the remaining size of bit image to compress as well as the compression ratio it has achieved in compressing the previous uncompressed bit image.

While this is an overview of a printer according to this invention, details and other aspects of the invention will become apparent in the detailed description that follows.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
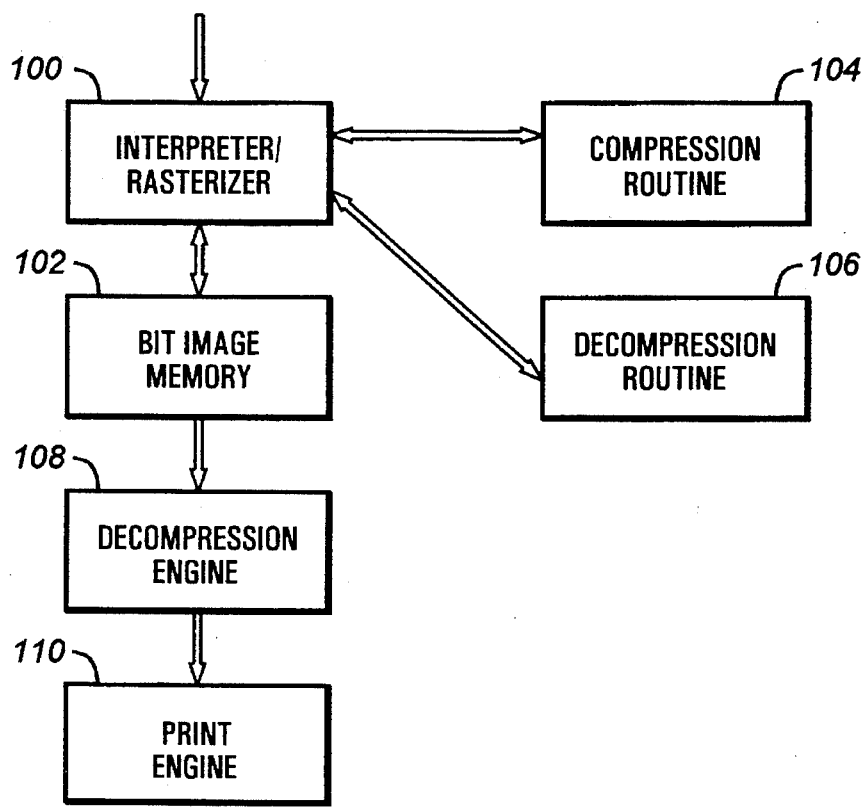
FIG. 1 shows a block diagram of the logical elements of a printer constructed according to the present invention.

Turning now to the drawings, FIG. 1 shows a block diagram of the major components of a printer constructed according to the present invention. The blocks and arrows illustrate the typical data flow in such a printer. An interpreter/rasterizer 100 receives the page description language (PDL) code from a host computer. The PDL could be any conventional PDL such as Postscript Level 2 or PCL 5, or preferably both on a document by document basis. This interpreter/rasterizer 100 typically consists of a microprocessor running a page description language interpreter program; this program interprets the page description language code and from that code generates a rasterized bit image.

This rasterized bit image is then stored in a bit image memory 102. As can be seen from the arrows, the interpreter/rasterizer 100 can also retrieve this rasterized bit image from the bit image memory 102 if the interpreter/rasterizer 100 needs to make changes in the rasterized bit image. In prior printers, this rasterized bit image was simply stored in its rasterized form. In a printer according to this invention, however, the rasterized bit image is first compressed by a compression routine 104. Thus, the interpreter/rasterizer 100 receives page description language code from a host computer, converts that code into a rasterized bit image, compresses that rasterized bit image using the compression routine 104, and then stores the resulting bit image in the bit image memory 102.

The interpreter/rasterizer 100 may need to modify a stored bit image, and to do so needs to decompress that stored bit image. The interpreter/rasterizer 100 retrieves the stored bit image from the bit image memory 102 and then decompresses that stored bit image using a decompression routine 106. The decompression routine 106 is the counterpart to the compression routine 104. The decompressed bit image is appropriately modified, recompressed using the compression routine 104, and again stored in the bit image memory 102.

The stored bit image cannot be directly printed because it is in compressed form. So, when it is desired to print the bit image, the stored image in the bit image memory 102 is decompressed by a hardware decompression engine 108, which then sends the decompressed image to a print engine 110. The hardware decompression engine 108 is typically a hardware implementation of the software used to implement the decompression routine 106. In the preferred embodiment, the hardware decompression engine 108 is implemented in an application specific integrated circuit. The print engine 110 is typically a serial device, in that it takes bits of data and serially stores those bits until it has a full page width of data, or a scan line. Then, the print engine 110 prints that scan line as a row of pixels. Then, of course, it prints another row of pixels, typically storing possibly one or two scan lines ahead.

In a laser printer built according to the invention, the interpreter/rasterizer 100 will typically be built using a microprocessor, such as the Advanced Micro Devices Am29000. This is a 32-bit RISC processor which can very quickly process the codes of page description language text. Associated with this processor would typically be associated random access memory making up the bit image memory 102, and likely would also include a read only memory, or ROM, which contains the software used to drive the microprocessor so that it can accomplish its interpreter/rasterizer functions. The decompression engine 108 will typically be a hardware ASIC, or application specific integrated circuit. This ASIC would be used when a general purpose processor would not be able to decompress the compressed image quickly enough for the print engine, or could also be used to leave the general purpose process free to perform other tasks. Finally, the print engine 110 is typically a Fuji or Canon print engine, both of which are well known print engines using replaceable cartridges and drums. Of course, this hardware is only illustrative, and the invention could be exercised using a number of other hardware and software platforms, and in fact could be exercised in hardware other than a printer, such as facsimile and scanning technology.

Memory

The bit image memory 102 shown in FIG. 1 has been described in simplified terms. In actual practice, the bit image memory 102 will typically contain far more than simply the compressed stored bit image.

Figure 2:
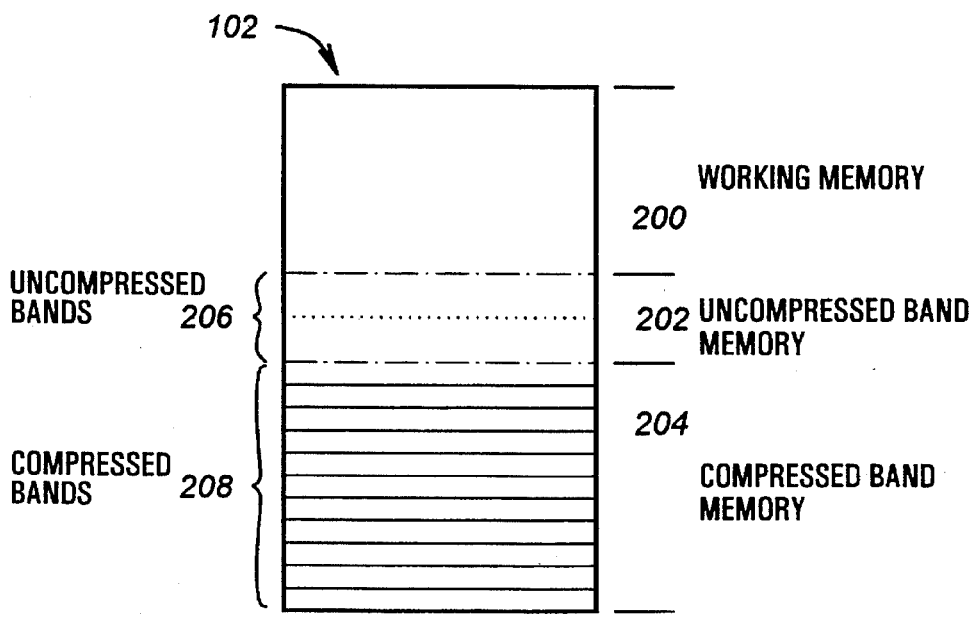
FIG. 2 shows a typical memory map in a printer constructed according to the present invention.

FIG. 2 shows how the interpreter/rasterizer 100 according to this invention typically uses the bit image memory 102. FIG. 2 shows a map of the bit image memory 102, which is divided into working memory 200, uncompressed band memory 202, and compressed band memory 204. These memory areas are not of arbitrary size or location but instead can be adjusted by the interpreter/rasterizer 100 depending on the needs of the system and the complexity of the current page. Further, the memory map shown in FIG. 2 is illustrative only, and could be implemented in a variety of ways depending on the interpreter/rasterizer 100. The working memory 200 is typically used for a variety of purposes such as for calculations used in converting the page description language page into a bit image and for storage of the bit images of individual characters generated from an outline font.

Interpreter programs for page description languages typically work with the rasterized page in bands of memory. As previously described, for example, PCL 5 attempts to "race" the print engine by generating bands of bit image ahead of the print engine. In a printer built according to this invention, however, not only are the uncompressed bit images stored in bands of memory, but also the compressed bit images. The interpreter/rasterizer 100 can then interpret the incoming PDL code one uncompressed band at a time, and then immediately convert that uncompressed band into a compressed band. This prevents the need for storing an entire uncompressed page in memory before converting it to a compressed page.

Thus, in a printer according to this invention, the bit image memory 102 contains bands of both uncompressed and compressed bit image. In the bit image memory 102, the uncompressed band memory 202 contains one or more bands of memory for the storage of uncompressed bands 206 of rasterized bit image. Similarly, the compressed band memory 204 contains a number of compressed bands 208 for storage of compressed segments of rasterized bit image. Because of the band oriented aspect of typical page description languages, the interpreter/rasterizer 100 generates a band of uncompressed image representing a portion, or band, of a page, and stores that as an uncompressed band 206 in the uncompressed band memory 202. This uncompressed band 206 typically includes an arbitrary number of scan lines, and is not split in the middle of a scan line. Once a full uncompressed band is generated, the interpreter/rasterizer 100 immediately compresses that uncompressed band 206 and stores the resulting compressed band of bit image in a compressed band 208 in the compressed band memory 204.

The bit image memory 102 typically contains a relatively large number of compressed bands 208, for example 64 to 256 compressed bands, and relatively few uncompressed bands 206. This memory may have only one uncompressed band 206 but would more likely have two or more. Having more than one uncompressed band 206 allows an uncompressed bit image to be rendered in a first uncompressed band 206 while a second uncompressed band 206 is being compressed into a compressed band 208. Then, once the first uncompressed band is fully rasterized, it can be compressed into a compressed band 208 while an uncompressed bit image is built into the second uncompressed band 206.

Each uncompressed band 206 is typically of arbitrary size, such as 500 kilobytes. Whatever the size, each uncompressed band 206 is typically made up of an integral number of scan lines; that is, a scan line is not split between two uncompressed bands 206. The compressed bands 208, however, of course vary in size depending on the compression ratio achieved by the compression routine 104. The compression ratio is defined as the size of an uncompressed image divided by the size of its corresponding compressed image. Because the interpreter/rasterizer 100 attempts to store as much of a page bit image as possible in the compressed band memory 204, less memory is needed to store a fully rasterized page using the compressed bands 208.

The Lempel-Ziv 77 Algorithm

To better understand the advantages of the invention, it is of assistance to be familiar with the Lempel-Ziv class of algorithms. These algorithms are well known in the computer art, and a good overview is provided in Ross N. Williams, *An Extremely Fast ZIV-Lempel Data Compression Algorithm*, DCC '91 Data Compression Conference 362 (James A. Storer & John H. Reif eds., 1991). The algorithm actually used in the preferred embodiment is slightly different from the one disclosed in the article, but follows the same principles.

Figure 3:
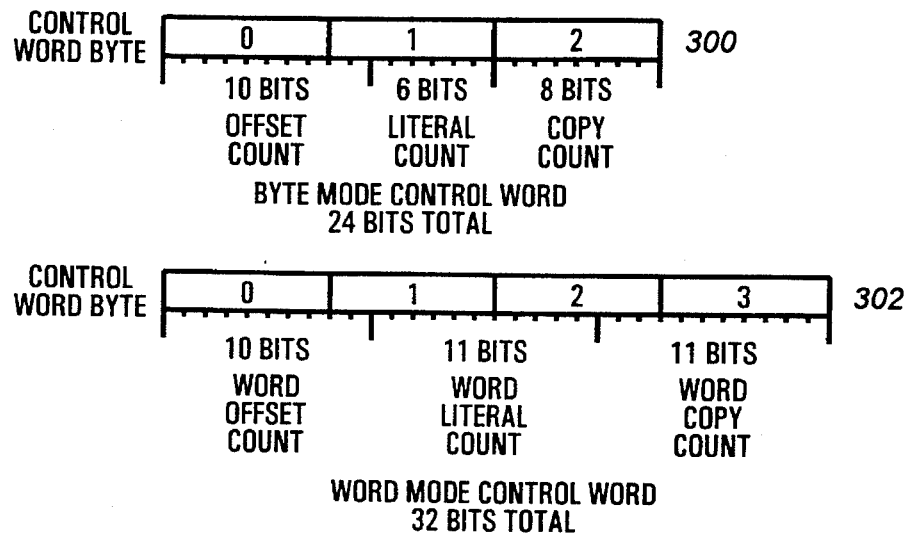
FIG. 3 shows the control word structure used by the Lempel-Ziv algorithms used according to the present invention.

As described in the Williams article, data compressed under a Lempel-Ziv algorithm is made up of control words and literals. As shown in FIG. 3, a 24-bit byte mode control word 300 is used in the compressed data. This byte mode control word 300 consists of an offset count 304, a literal count 306, and a copy count 308. The literal count 306, a value between 0 and 63, specifies how many of the following bytes in the compressed code are literals. For example, if the literal count 306 is five, then the next five bytes of data are copied to the uncompressed destination block directly.

The offset count 304 and copy count 308 are the fields through which actual compression is accomplished. The copy count 304, a value between 0 and 255, indicates how many bytes of data recently written to the uncompressed destination block are to be copied as new uncompressed data. The offset count 304 specifies how far back into the previously written destination block, known as "the history," to look for those bytes to copy. As the offset count 304 is finite, being a value between 0 and 1023, it can only specify a limited part of the history in which to look. This part of the history, here 1023 bytes back, is known as "the Lempel." So, for example, a copy count 308 of three and an offset count 304 of four would mean "look back 4 bytes into the history and from there copy 3 bytes to the current location." As an example, given the data "ABCDABC," the data could be encoded as "ABCD go back 4 and copy 3" resulting in ABCDABC upon decoding. In actual practice, the size of the data unit and the control word are not arbitrary, but could be set to other values. For example, the data unit could be a 32-bit word rather than an 8-bit byte and the control word could be 16 or even 64 bits in length.

As can be seen in FIG. 3, two alternative control words are provided according to the invention, a 24-bit byte mode control word 300 and a 32-bit word mode control word 302. The differences between these two will soon become apparent.

Compression

Figure 4:
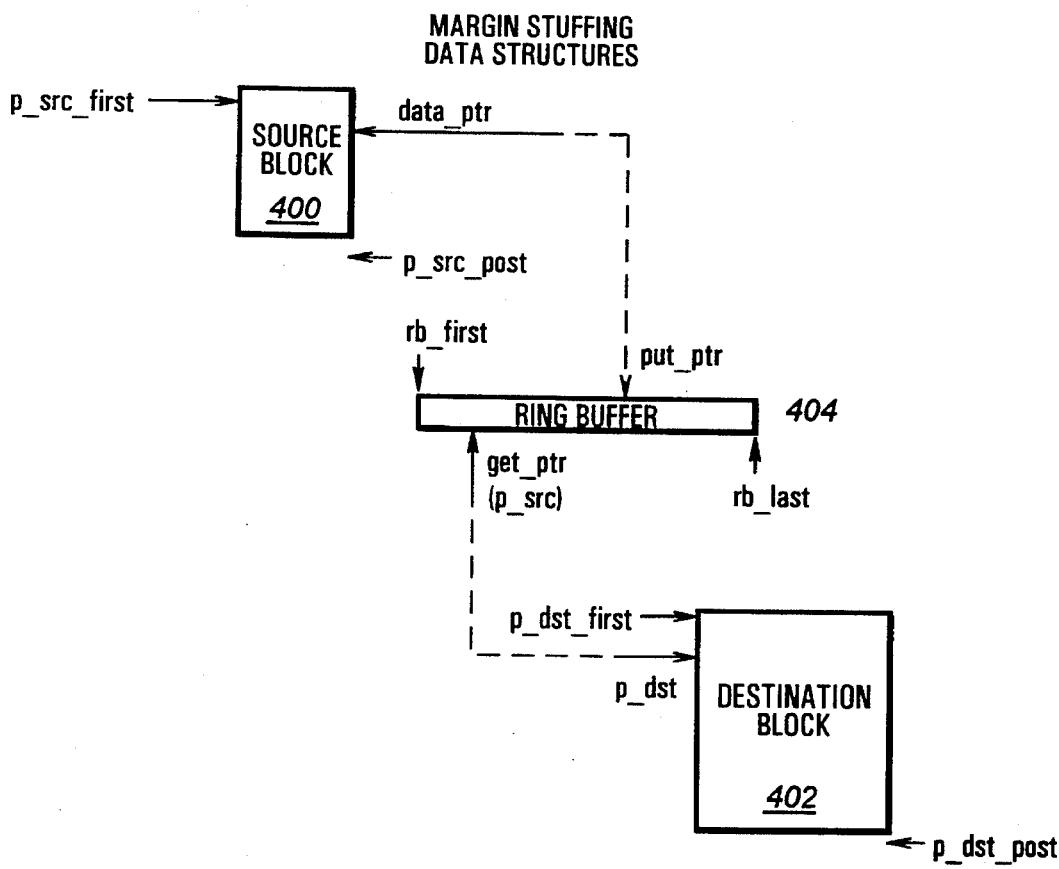
FIG. 4 shows the data blocks and ring buffer used to add margin white space in a printer constructed according to the present invention.

To better understand the compression and decompression functions according to the invention, FIG. 4 shows the data structures used in transferring data from a source block 400 to a destination block 402. The source block 400 and the destination block 402 correspond, in the case of compression, to an uncompressed band 206 and a compressed band 208; in the case of decompression, they correspond to a compressed band 208 and an uncompressed band 206. The source block 400 and the destination block 402 have associated pointer variables to keep track of the data being removed from and inserted into those blocks. Associated with the source block 400 are p_src_first, which points to the first byte of the source block 400, and p_src_post, which points to the first byte beyond the end of the source block 400. To track the data being removed, data_ptr points to the next byte to be taken from the source block 400. Associated with the destination block 402 are p_dst_first, which points to the first byte of the destination block 402, and p_dst_post, which points to the first byte past the end of the destination block 402. The variable p_dst points to the next available free byte of the destination block 402.

An intermediate ring buffer 404 is used in the process of compressing and decompressing the data. This ring buffer 404 allows for the efficient addition and elimination of margin white space, as will later be discussed. This ring buffer 404 is typically located in the working memory 200.

Variables associated with the ring buffer 404 include rb_first, which points to the first byte of the ring buffer, and rb_last, which points to the first byte past the end of the ring buffer. For placing data into the ring buffer 404, put_ptr points to the next free byte at which to put data. To remove data from the ring buffer 404, get_ptr points to the next byte to remove from the ring buffer 404.

This ring buffer 404, 8 k bytes in size in the preferred embodiment, is circular in the sense that as data is retrieved from the source block 400 and placed into the ring buffer 404, put_ptr will "wrap around" to rb_first when put_ptr reaches rb_last. The same holds true when data is retrieved from the ring buffer 404 to the destination block 402; the variable get_ptr will "wrap around" to rb_first when get_ptr reaches rb_last.

As will be seen, this ring buffer 404 is used as a "pseudo source block." The source block 400 contains uncompressed data without any margin white space. This white space is added to the data in the source block 400 as that data is transferred to the ring buffer 404. Thus, rather than storing the white space for each scan line in the uncompressed data in the source block 400, the margin white space is only present in the smaller ring buffer 404. This ring buffer 404 acts as a "pseudo source block" in the sense that the data retrieved from that ring buffer would be the equivalent of the data in the source block 400 if the data in the source block 400 initially had its margin white space.

So, as shown in FIG. 4, an additional variable, p_src, is associated with the ring buffer 404. This variable is simply for the convenience of discussing the algorithm without dealing with the technicalities of the ring buffer 404. Whenever the ring buffer 404 is referred to in terms of get_ptr and put_ptr, its circular nature shall be explicitly described in relationship to those variables. When, however, the ring buffer 404 is referred to in terms of the variable p_src, the ring buffer 404 is being referred to in its "pseudo source block" sense. That is, any sort of wrapping associated with the ring buffer 404 is implicit, and any looking backwards and looking forwards will implicitly include the steps necessary to wrap around at rb_first and rb_last. Thus, p_src can be looked to as a pointer into a linear data block, rather than a ring. In any case, the values of get_ptr and p_src will always be equal; they are merely different pointers used to refer to the same value.

Figure 5:
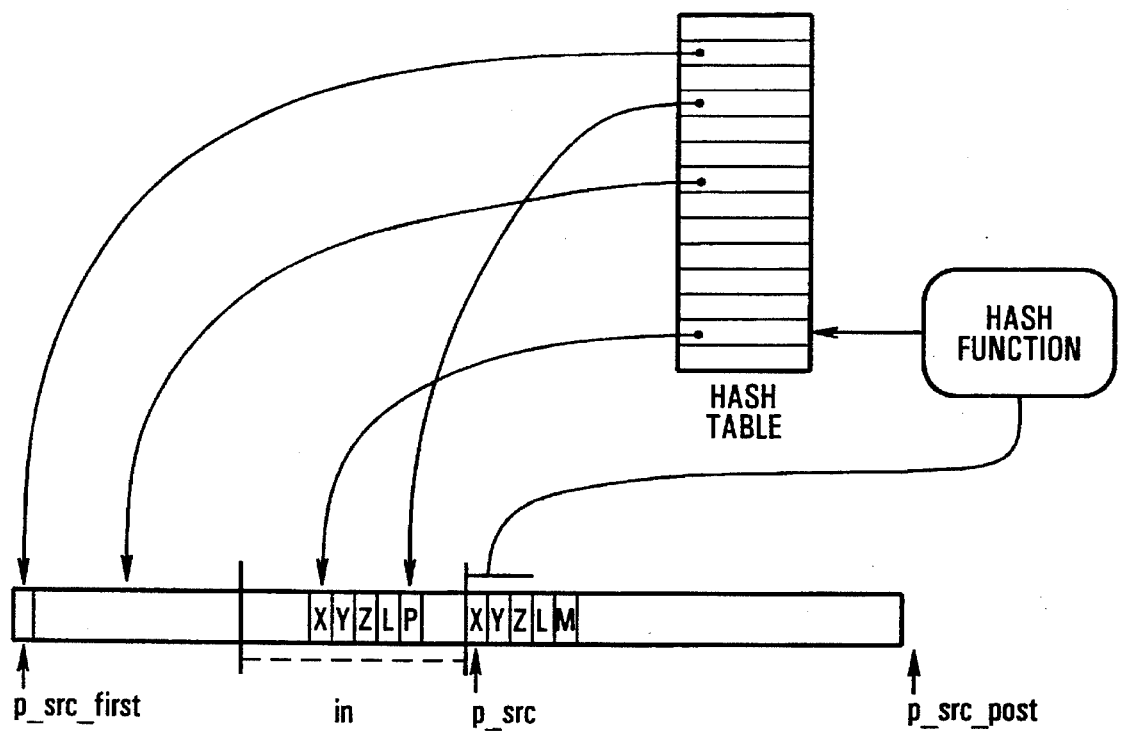
FIG. 5 shows data structures used in compressing data under prior art Lempel-Ziv 77 algorithms.

Of further assistance is FIG. 5, which illustrates the typical use by Lempel-Ziv 77 algorithms of a hash function and hash table to generate compressed data. See Donald E. Knuth, *Sorting & Searching* 506, et seq. (1973). A hashing function maps a given key into a hash table, where there are more keys than locations in that hash table. For example, the preferred embodiment uses a hash table with 2,048 words, where a word is 32 bits. As a hash index into that table, however, the preferred embodiment uses the next three bytes, or 24 bits, of source data. Since 24 bits will map into over 16 million different elements, there obviously must be a way to map more than one key to each element of the hash table. This is what hashing functions do, and as mentioned they are well known in the field of computer technology.

Although, generally, sophisticated hashing functions are used which attempt to randomize the keys as much as possible, the preferred embodiment according to this invention simply takes the 11 most significant bits of the next three bytes of source data and uses these bits as an index into the hash table. Then, the pointer address contained at that location of the hash table is retrieved, and the data pointed to is examined. If the data pointed to is in the Lempel and actually matches the data to be compressed, a copy run is generated in the compressed code. This copy is represented by setting the offset count 304 to indicate the offset back into the uncompressed data at which matching data begins, and setting the copy count 308 to the number of bytes to copy of that run. Finally, the pointed to element of the hash table is set to point to the data that was initially hashed, as that data is now the most recent data corresponding to that hash location. Again, this is typical of Lempel-Ziv 77 algorithms and is well known in the art.

FIGS. 6A–6D show a flow chart of the compression routine 104 implementing features according to the invention. In this flow chart, certain variables correspond to certain data structures. The source block 400 is designated as "source" in the flow chart, and the destination block 402 is designated as "dest." Further, this flow chart contemplates the use of byte mode control words 300; the variable p_control is used to point to the current location in the destination block 402 at which to store the current byte mode control word 300. Finally, as fields of this variable, the variables offset_cnt, lit_cnt, and copy_cnt corresponds to the offset count 304, the literal count 306, and the copy count 308.

A COMPRESS routine 600, in step 602, first fills the ring buffer 404 with data from the source block 400 by executing a FILL_RING routine 680. This step is more fully illustrated in FIG. 6D, which will be discussed later.

Next, at step 604, each hash table index is loaded with rb_first, a pointer to the first address of the ring buffer 404. This is better illustrated in FIG. 9, which will be discussed later.

MAX_COPY_CNT is set to 249 at step 606. This "constant" specifies the maximum number of bytes, here 249, that the copy count 308 in a byte mode control word 300 can specify to copy from the Lempel. Two control words can occur consecutively to double that number, but a single control word is limited to a copy run of MAX_COPY_CNT bytes. This MAX_COPY_CNT amount has in the past been specified as a constant, but in the preferred embodiment is later altered at step 618.

At step 608, a first byte mode control word 300 and one literal are written to the destination block 402. This initial control word specifies an offset count 304 of zero, a copy count 308 of zero, and a literal count 306 of one. This simply means the next byte in the destination block 402 is a literal. To this end, a literal is copied from the ring buffer 404 at p_src, and then p_src is incremented to point to the next byte of the ring buffer 404. As previously mentioned, p_src is the equivalent of get_ptr, except that a reference to p_src implicitly includes any wrapping around to rb_first when p_src reaches rb_last.

Also at step 608, set to zero are the variables offset_cnt, copy_cnt, and lit_cnt, which are used to store the values of the offset count 304, copy count 308, and literal count 306 of the byte mode control word 300 which will later be stored at p_control.

At step 610, p_control is set to p_dst. The variable p_control points to the current byte mode control word 300 in the destination block 402. A pointer to the current control word must be maintained because p_dst will subsequently be adjusted as literals are copied, but the ultimate literal count 306 of this control word will not be known until a complete run of literals has been copied. When all of the literals are copied, then the literal count 306 of the byte mode control word 300 pointed to by p_control must be set to this ultimate number of copied literals.

At step 612, the routine determines whether p_dst is within forty bytes of p_dst_post. If so, then the destination block 402 is nearly full, and special steps must be taken illustrated starting with step 654, described later. If not, the routine proceeds normally to step 614 where the ring buffer is filled, again by the routine whose flow chart is in FIG. 6D. Because the ring buffer 404 has previously been filled, it will still be full, but this routine is needed here as it will be reentered in a subsequent loop.

In step 616, the routine determines whether over 255 bytes of data are left to be compressed by determining whether at least 255 bytes of unprocessed data remain in the ring buffer 404. This is accomplished by subtracting get_ptr from put_ptr if put_ptr is greater than get_ptr, or otherwise by subtracting get_ptr from put_ptr plus the length of the ring buffer 404. The ring buffer 404 will only become this empty if correspondingly little data remains in the source block 400. If 255 bytes or less remain, step 618 sets MAX_COPY_CNT to 16. MAX_COPY_CNT was previously set to 249 in step 606. As will be seen, reducing MAX_COPY_CNT prevents the compression routine from attempting to generate a copy run longer than the data remaining in the ring buffer 404, a possibility when p_src approaches within MAX_COPY_CNT bytes of the end of that remaining data. By reducing this count, the routine can compress data that is closer to the end of the remaining data than would normally be possible. This provides improved compression efficiency.

After setting MAX_COPY_CNT to 16, the routine determines, using the same technique as for 255 bytes, whether over 24 bytes of data remain in the ring buffer 404 to be compressed. If the ring buffer 404 contains less than 24 bytes left to compress, then the routine will, in steps 644 to 652, copy the remaining bytes as literals without attempting to compress then. If, however, more than 24 bytes remain, the routine attempts compression starting at step 624 FIG. 6B.

Figure 6A:
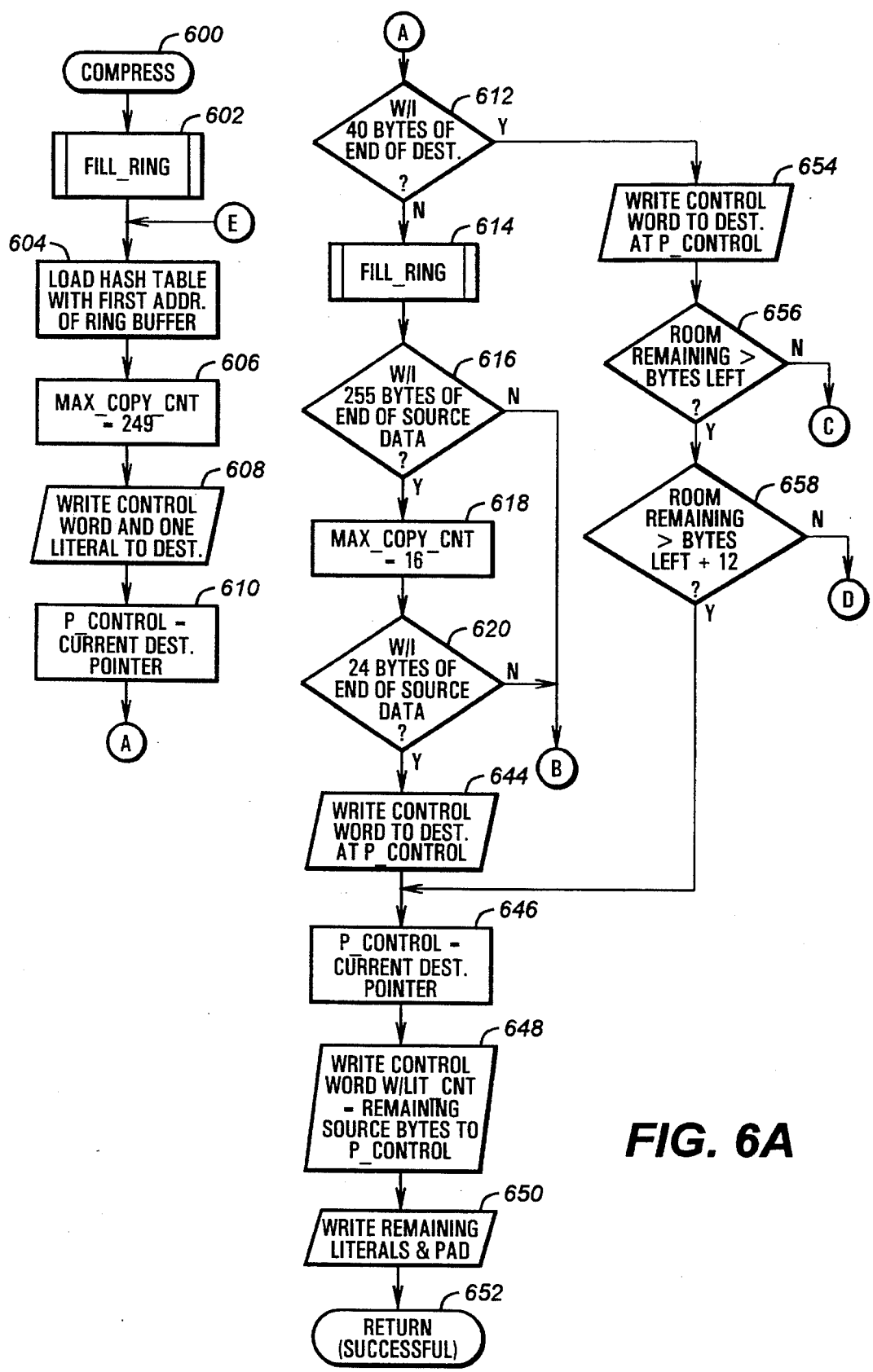
FIGS. 6A–6E show a flow chart of a compression routine written according to the present invention.
Figure 6B:
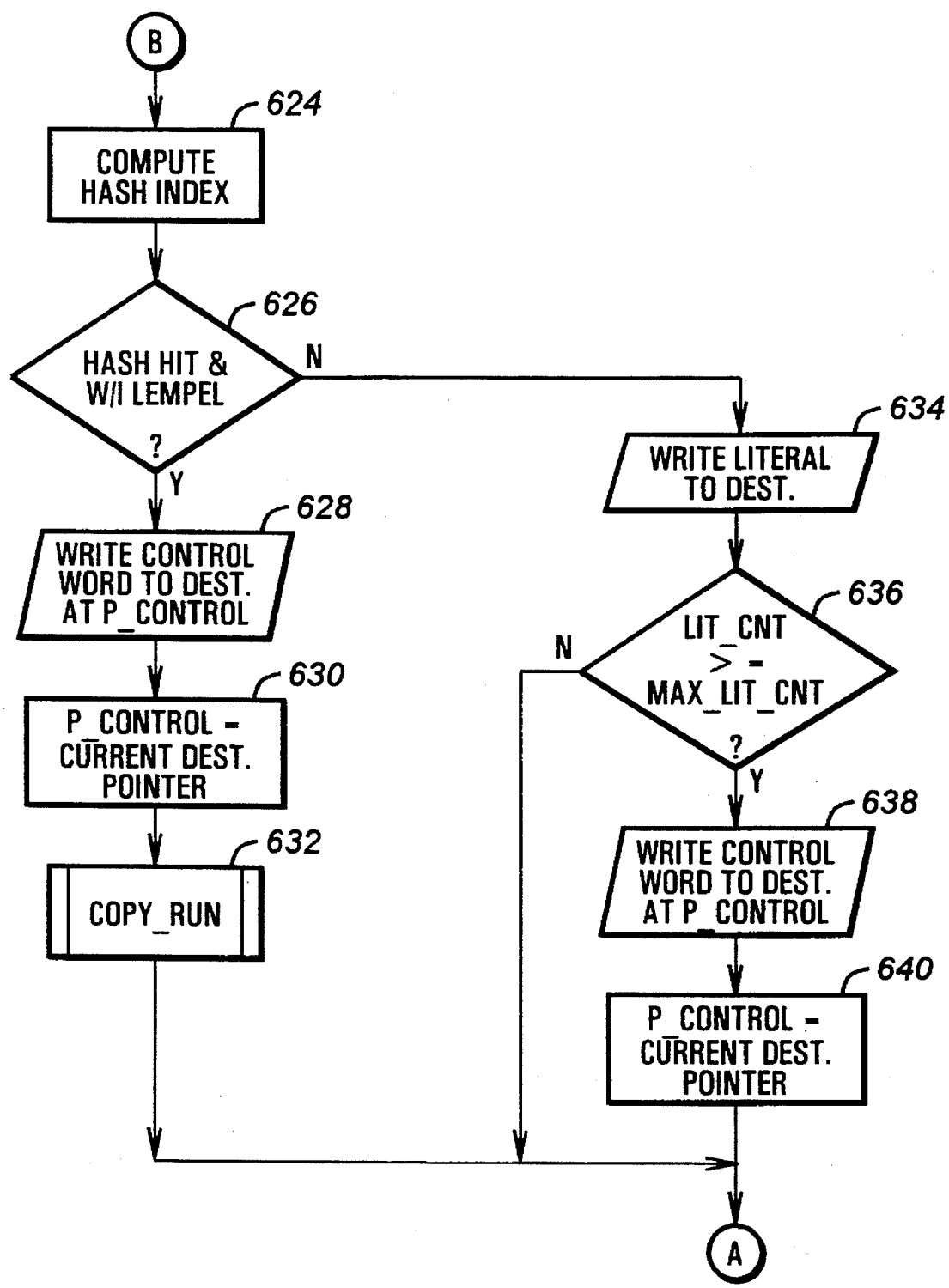

In FIG. 6B, the routine attempts compression by determining whether a copy string can be copied from the history. The routine first computes a hash index at step 624 from the first three bytes pointed to by p_src. In this embodiment, the first 11 bits of these three bytes are used as an index into the hash table. Of course, a number of other methods of generating this index are possible, as discussed in Donald E. Knuth, *Sorting & Searching* 506, et. seq. (1973). This hash index then indexes to a certain item in the hash table, which in this embodiment contains 2048 such locations. The indexed location contains an address that may or may not point into the Lempel. If the address does not point into the Lempel, then a hash miss has occurred. If the address does point into the Lempel, a hash bit may have occurred, but the addressed bytes in the Lempel must first be compared to the first three bytes pointed to by p_src. This comparison is necessary because, as previously mentioned, while the hash function uses the three bytes to generate in index into the hash table, each unique three bytes does not generate a unique hash value, and thus the first three bytes pointed to by the address located at the indexed location in the hash table will not necessarily match the three bytes from which the hash index was generated. If these three bytes match, a hash hit has occurred, otherwise one has not. Three bytes are compared because a copy run shorter than three bytes would be inefficient. In any case, p_src, the current address in the ring buffer 404, is stored in the indexed location in the hash table, as p_src now contains the most recent match for the computed hash index. This is all done at step 626.

If a hash hit has occurred, at step 628 the current byte mode control word 300 is written to the destination block 402 at p_control. Then p_control is loaded with p_dst at step 630. The current control word, which is the current values of the variables offset_cnt, lit_cnt and copy_cnt, is written to p_control because the hash hit indicates a copy run has begun, and that indicates any previous literal run is ended. Thus, lit_cnt has reached its final value and can be written to the control word stored at p_control. Then, copy_cnt, lit_cnt, and offset_cnt are set to zero for a new copy run followed by a new literal run.

At step 632, the routine calls COPY_RUN. The routine COPY_RUN 1000, shown in FIG. 6E, sets the variable copy_cnt to the number of bytes in the Lempel starting back [p_src—offset_cnt] that match the bytes starting at p_src, up to a maximum of MAX_COPY_CNT bytes. This is a copy run. Exactly how this is accomplished is shown in FIG. 6E, which is a flow chart of the routine COPY_RUN 1000. Turning to FIG. 6E, the routine begins at step 1002 by loading the temporary variable P with the address indexed to in the hash table and by loading the temporary variable S with p_src. Thus, P points to the start of the string in the Lempel that the routine will compare with the current string pointed to by S. Also at step 1002 the routine sets loop_cnt to negative MAX_COPY_CNT.

At step 1004, the routine determines if both P and S are less than rb_last—MAX_COPY_CNT. If they are not both less than that value, then during the comparison loop, the routine runs the risk of comparing past the end of the ring buffer, or past rb_last. So, the routine must then check after each comparison to determine if P or S must be wrapped around to the beginning of the ring buffer 404, or rb_first. If, however, both P and S are less than that value, then there is no risk of reaching the end of the ring buffer 404 during the comparison, and such a check need not be made after every iteration through the loop.

Because this comparison loop for determining the copy count 308 is repeatedly executed during calls to the compression routine 104, the routine does not simply check to see if the end of the ring buffer 404 is reached in both cases. Thus, any improvements in efficiency of this routine result in higher speeds of compression. Therefore, this comparison loop for generating the copy count 308 benefits when any instruction can be eliminated.

Also in this COPY_RUN routine 1000 the advantage of altering MAX_COPY_CNT at step 618 becomes apparent. The value of MAX_COPY_CNT, the negative of which has been loaded into loop_cnt, is now an incremental counter to determine the maximum size of a copy run. The routine could simply check to see if the end of the source data has been reached after each comparison in the COPY_RUN routine 1000. It is far more efficient, however, to have a register variable containing this maximum value. In past Lempel-Ziv 77 algorithms, when the routine had compressed data to within MAX_COPY_CNT bytes of the end of the source data, the routine would simply quit compressing and copy the remaining source data to the destination as literals. By reducing MAX_COPY_CNT, however, the routine COPY_RUN 1000 can continue compressing much nearer the end of the data in the source block 500. This will become apparent as the COPY_RUN routine 1000 is further described.

Continuing with the case in which neither P nor S is within MAX_COPY_CNT bytes of the end of the ring buffer 404, loop_cnt is incremented at step 1006. Then, at step 1008, loop_cnt is compared to zero. If loop_cnt is zero, then MAX_COPY_CNT bytes of data pointed to by P and S have been successfully compared, and a maximum size copy run has been generated. In such a case, the loop terminates.

If, however, loop_cnt is not equal to zero, then further bytes can be compared. At step 1010, the routine compares the byte pointed to by P with the byte pointed to by S. If they are not equal, then the current copy run has ended, and the loop terminates. If, however, they are equal, the loop continues to step 1012 and increments both P and S. Then, the loop repeats, starting at step 1006.

When the loop terminates, it proceeds to step 1014, where copy_cnt is set to MAX_COPY_CNT—[loop_cnt+3]. This is the number of successfully compared bytes plus the three original bytes. Further at step 1014, the routine sets p_src to S, which now points past the successfully compared source data. The routine COPY_RUN 1000 continues at step 1016 by setting the offset count 304 to the current offset. Then, at step 1018, the routine returns to FIG. 6B.

If the P or S are within MAX_COPY_CNT bytes of the end of the ring buffer 404, the COPY_RUN routine executes a similar loop starting at step 1020, incrementing the loop count. Then at step 1022, it compares loop count to zero. If the loop count is not zero, the loop continues to step 1024, where the result of the comparison of the data pointed to by P and S is stored in a temporary variable result, and P and S are incremented.

Then, different from the previous loop, P and S are each compared to rb_last, and if equal to rb_last, they are wrapped around to rb_first. At step 1026, if the result of the previous comparison of the data pointed to by P and S is false, the loop terminates through 1028. Step 1028 decrements S, and if S is below rb_first, wraps S around to the end of the ring buffer 404, rb_last. Then, as with the previous loop, the routine proceeds to step 1014, and does its necessary housekeeping at that step and step 1016, and then returns at step 1018.

The advantage of adjusting MAX_COPY_CNT in step 618 can now be understood. If MAX_COPY_CNT remained 249 throughout the compression routine 104, then the COPY_RUN routine could attempt to generate a copy run longer than the source data remaining to be compressed from the source block 400. For example, if p_src was within 100 bytes of the end of valid data remaining in the ring buffer 404, and a string in the Lempel matched the remaining 100 bytes of valid source data in the ring buffer 404, as well as matching 25 bytes of remaining random data past the end of that remaining valid data, the COPY_RUN routine would attempt to generate a copy run of 125 bytes. That, of course, would be longer than the remaining valid data and would thus add spurious data to the end of the data encoded to the destination block 402.

Prior routines avoided this problem simply by stopping compression once p_src was within MAX_COPY_CNT bytes of the end of the data remaining to be compressed. According to the invention, this routine, rather than stopping compression within 249 bytes of the end of the source data, adjusts MAX_COPY_CNT so that compression can continue to within 24 bytes of the end of the source data. As the end of the source data corresponds to the end of a scan line, and as scan lines typically end with a run of white space, this adjustment provides for much greater efficiency and compression, because that white space will then be more compressed.

If at step 626 no hash hit occurred, then control passes to step 634, where the current literal pointed to by p_src is written to the destination block 402. A literal run can, in this embodiment, contain as few as zero bytes or as many as 63 bytes. In this embodiment, literals are bytes, but the literal size is of course arbitrary, as is the maximum length of the literal run. The literal count variable lit_cnt is incremented and then, at step 636, compared to its maximum allowable count, that count being 63 bytes. If that count has been reached, the current literal run is ended by writing the current control word of offset_cnt, lit_cnt, and copy_cnt to the destination block 402 at p_control and setting p_control to the current destination pointer p_dst at step 640. The current control word variables offset_cnt, lit_cnt and copy_cnt are also reset to zero. If lit_cnt has not reached its maximum allowable count, control passes to connector 642, which is the beginning of the main loop shown in FIG. 6A.

Returning to FIG. 6A, if at step 620 p_src is not within 24 bytes of the end of source data, control passes to step 644, where the current control word (offset_cnt, lit_cnt, copy_cnt) is written to the destination block 402 at p_control, and at step 646 p_control is set to the current destination pointer p_dst. Then at step 648 a new control word is written with a literal count equal to the number of bytes actually remaining to compress in the ring buffer 404, and at 650 the remaining bytes are written as literals to the end of the destination block 402, and the destination block 402 is further padded with null control words, if necessary. The routine is then complete and a successful return is executed at step 652.

If at step 612 p_dst is within 40 bytes of p_dst_post, then there may be a lack of remaining space in destination block 402. So, at step 654 the current control word is written, and at step 656 the amount of room left in the destination block 402 is compared to the amount of data left to compress in the ring buffer 404. If sufficient room is not available, control passes through to step 662 in FIG. 6C. If sufficient room remains, control passes to step 658, which compares the room in the destination block 402 to the amount of data left to compress plus 12. This is done to check for sufficient "house keeping" space in the destination block 402. If there is not sufficient room in the destination block 402 at this step, control passes to step 678 in FIG. 6C.

Otherwise, sufficient room is available to store in the destination block 402 the data remaining to be compressed from the ring buffer 404. So control passes to step 646, described above, where the remaining bytes from the ring buffer 404 are written as literals and a successful return is executed.

Figure 6C:
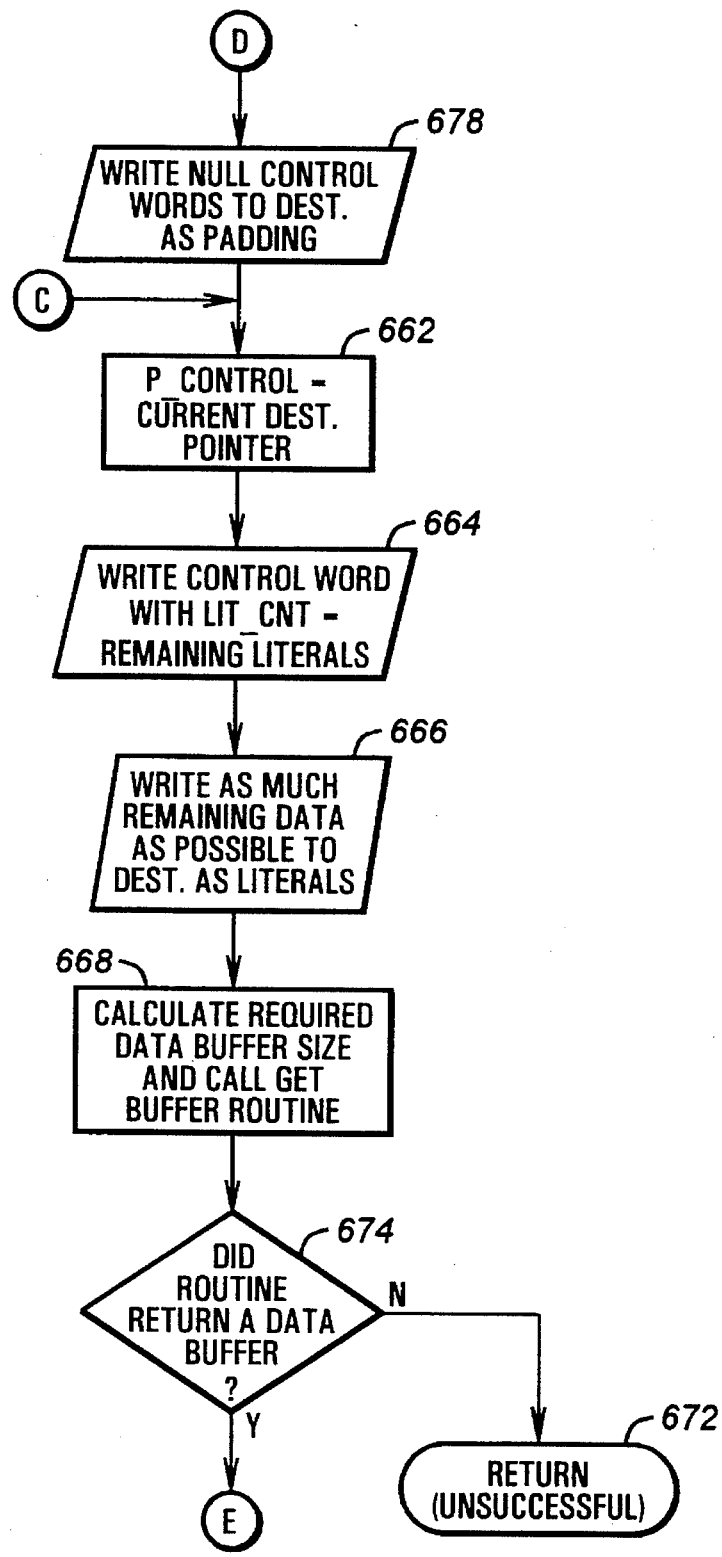

If sufficient room does not remain in the destination block 402 to store the data remaining in the ring buffer 404 and any housekeeping space, then a sequence of steps, shown in FIG. 6C, are executed in an effort to obtain an additional destination block 900. If enough room remained at steps 656 and 658 to store the remaining literals, but not enough room to store the remaining literals plus the necessary house keeping data, then FIG. 6C is entered at step 662. If there was simply not enough space at all to store in the destination block 402 the remaining data in the ring buffer 404, then FIG. 6C is entered at step 678. Starting from connector 660, the program fills the remainder of the destination block 402 with literals from the ring buffer 404.

The variable p_control is set to p_dst at step 662, a control word with lit_cnt equal to the remaining space in the destination block 402 is written to the destination block 402 at step 664, literals are written from the ring buffer 404 to fill as much of the remaining space in the destination block 402 as possible at step 666, and step 668 calculates the required destination space for the remaining data in the source block 400 and calls a get additional buffer routine. This routine attempts to obtain an additional destination block sufficient for holding the data remaining in the source block 400. If the get buffer routine at step 670 was successful, step 674 returns to the start of the compression routine 104, preserving the data remaining to compress in the ring buffer 404.

If the get buffer routine at step 670 does not return an additional buffer, step 672 returns unsuccessfully from the compression routine 104. Then, the interpreter/rasterizer 100 takes whatever steps are appropriate for an out of memory situation. Various commercial PDL interpreters handle such situations in various ways; typically they fail to print and then return an error code to the host computer. Alternatively, the interpreter/rasterizer 100 can downsample, or reduce the effective print density at which it stores the bit image. For example, if the interpreter/rasterizer 100 was compressing data to be printed at 600 dots per inch, it could instead switch to 300 dots per inch, thereby reducing memory requirements. As another alternative, the interpreter/rasterizer 100 can instead invoke a "lossy" compression algorithm on the data upon which compression failed. A "lossy" algorithm improves the compression ration by reducing the accuracy with which the data is compressed.

If FIG. 6C was entered through step 676, then sufficient literals do not remain to fill the rest of the destination block 402, so instead the destination block 402 is padded with null control words. Step 678 initially writes null control words to the end of destination block 402 as padding. Then, steps 662 through 674 are executed to obtain the additional destination block 900. In the execution of steps 664 and 666, of course, no remaining literals are copied because the routine has already padded the rest of destination block 402 with null control words at step 678.

Ring Buffer

Figure 6D:
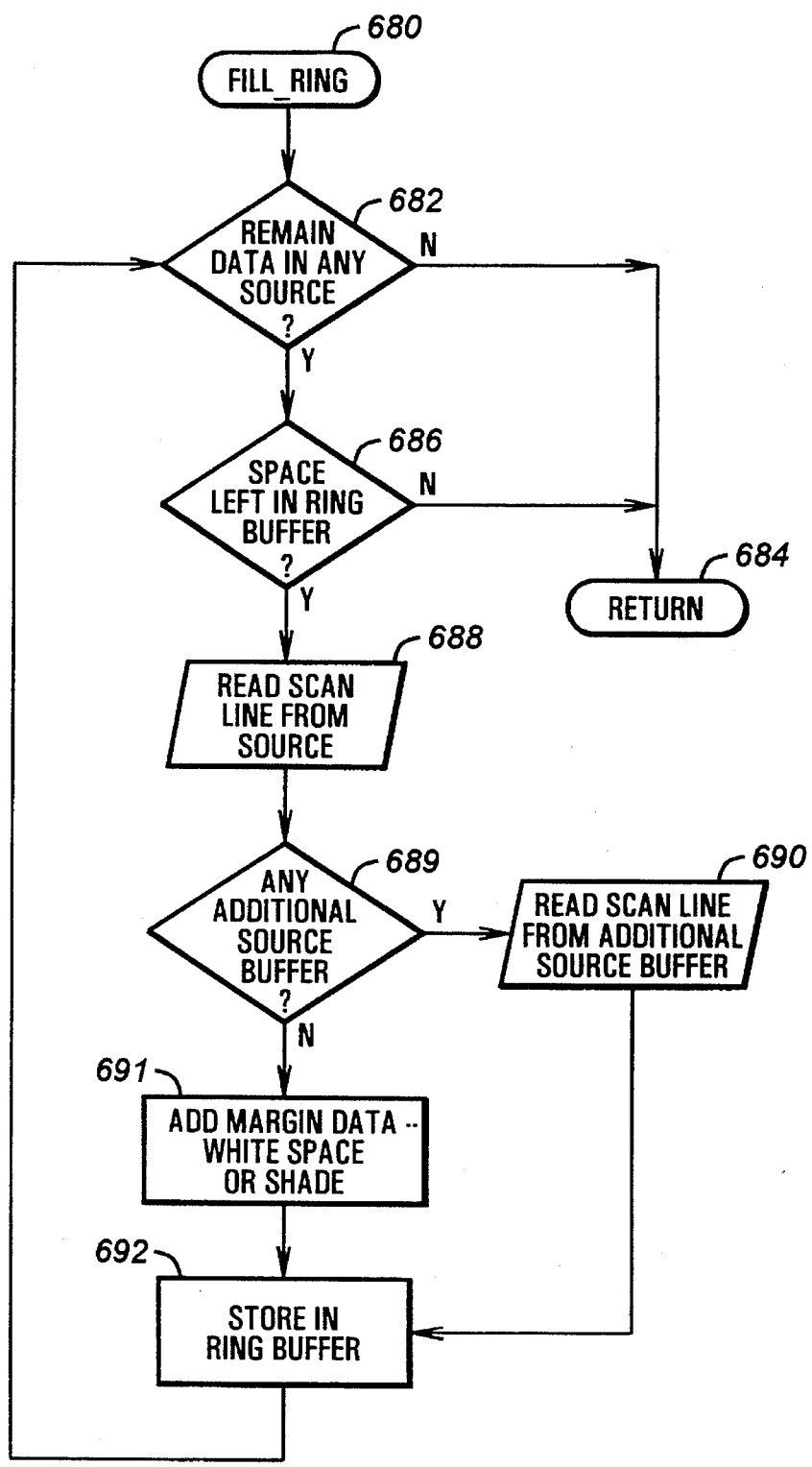
Figure 6E:
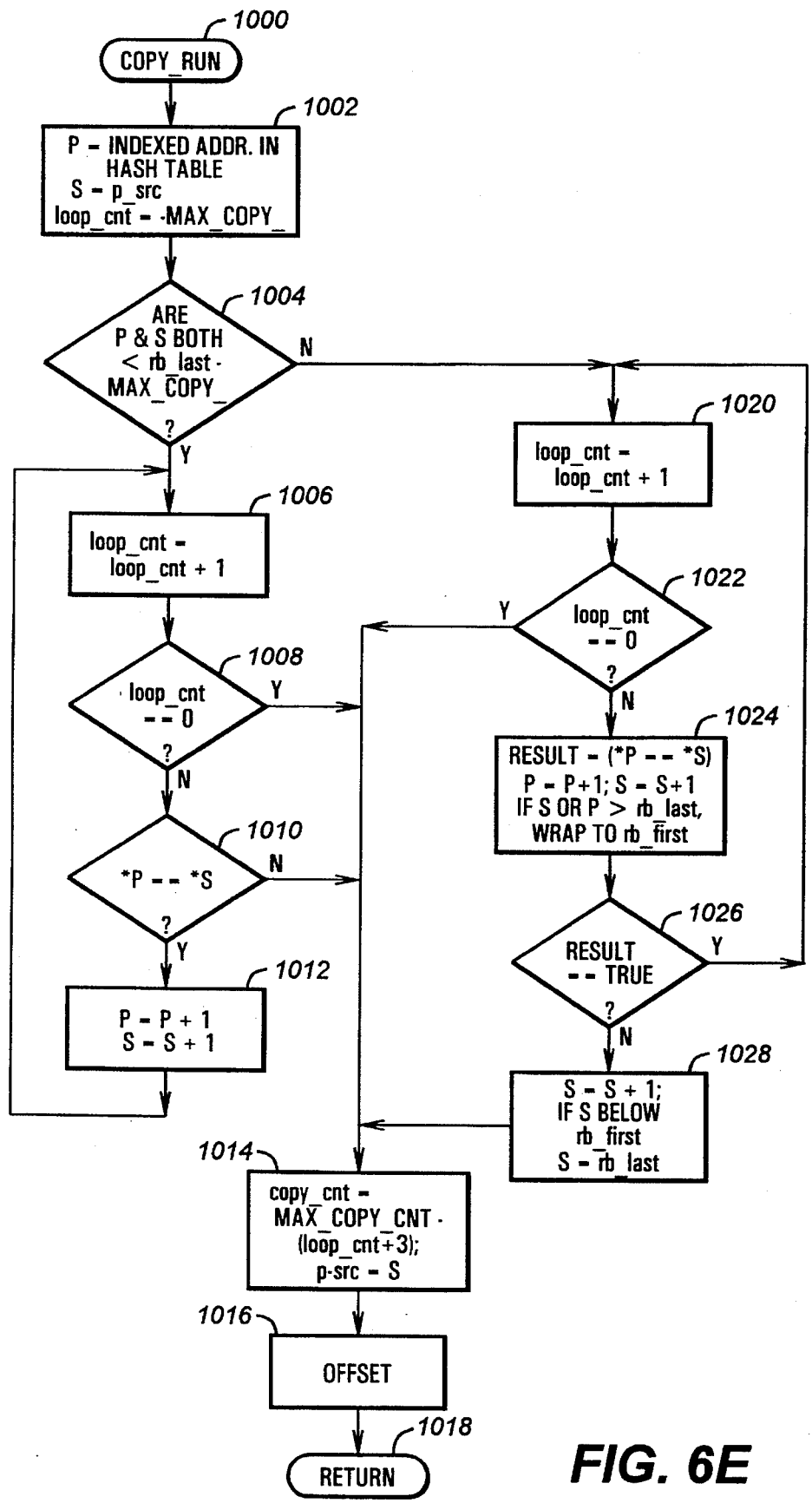

FIG. 6D shows the routine 680 that fills the ring buffer 404, called by steps 602 and 614 of FIG. 6A. This routine provides for the ultimate addition of margin white space to the compressed destination block 402. Instead of, or even in addition to, adding margin white space, this routine could combine multiple source buffers of data into one compressed destination buffer. For example, if it were desired to print two side-by-side bit images, this routine could provide that functionality. To implement such a feature, the ring buffer would use additional source buffers along with the source block 400. These additional source buffers would be similar to the source block 400, but the scan lines would not necessarily need to be the same length. In FIG. 6D, it is assumed that there may be one additional source buffer.

At step 682, FILL_RING 680 determines whether the source block 400, or the additional source buffer, if any, contains any more data. This is done in the source block 400 by determining if data_ptr has reached p_src_post, and is correspondingly done in any additional source buffer. If not, no data remains to load into the ring buffer 404, so the routine returns at step 684.

If data remains, step 686 determines whether space remains in the ring buffer 404. Space remains in the ring buffer 404 if a scan line from the source block 400, plus a scan line from any additional source buffer, can be added to the ring buffer 404 without overwriting the Lempel, which in this case is 1024 bytes long. This Lempel must be maintained for generating the copy runs. The size of the scan line from the source block 400 plus a scan line from any additional source buffer will be less than the physical scan line width use by the print engine 110.

If no space remains in the ring buffer 404, a return is executed at step 684. Otherwise, step 688 reads one scan line from the source block 400. Control then proceeds to step 689 to determine if two source buffers are being combined. If, at step 689, no additional source buffer is present, then step 691 adds margin data, in the form of white space, shading, or some other pattern, to the beginning and end of the scan line as determined by the white space count needed to add a specified margin. The white space is added by preceding the scan line with a predetermined number of null bytes, or whatever arbitrary pattern is needed. Each bit in each null byte corresponds to a pixel of white space that will precede the data in the scan line. White space can be added to the end of a scan line for padding.

If, at step 689, an additional source buffer is present, then a scan line is read from that additional source buffer and appended to the scan line read from the source block 400 at step 688.

Once the white space or the additional buffer scan line is added, step 692 stores the resulting scan line into the ring buffer 404 and adjusts the pointers accordingly. This is done by sequentially adding a byte of the modified scan line to the ring buffer 404 at put_ptr and immediately determining if the end of the ring buffer 404, rb_last, has been reached. If rb_last has been reached, the routine continues to add the scan line, but first resetting put_ptr to the beginning of the ring buffer 404, rb_first. In this way, the scan line will wrap around if the end of the ring buffer 404 is reached.

The pointers are adjusted, in reference to FIG. 4, by incrementing put_ptr for each byte of the scan line added. When put_ptr reaches rb_last, put_ptr is reset to rb_first. In this way, the scan line wraps around. To prevent the Lempel from being overwritten, the routine determines whether put_ptr is within 1024 bytes of get_ptr. If put_ptr is higher in the ring buffer 404 than get_ptr, this determination is made by adding rb_last minus put_ptr to get_ptr minus rb_first. If put_ptr is lower in the ring buffer 404 than get_ptr, this determination is made by subtracting put_ptr from get_ptr. This is then the space remaining for the Lempel. Then, the entire routine is repeated by jumping to step 682.

Decompression

Figure 7:
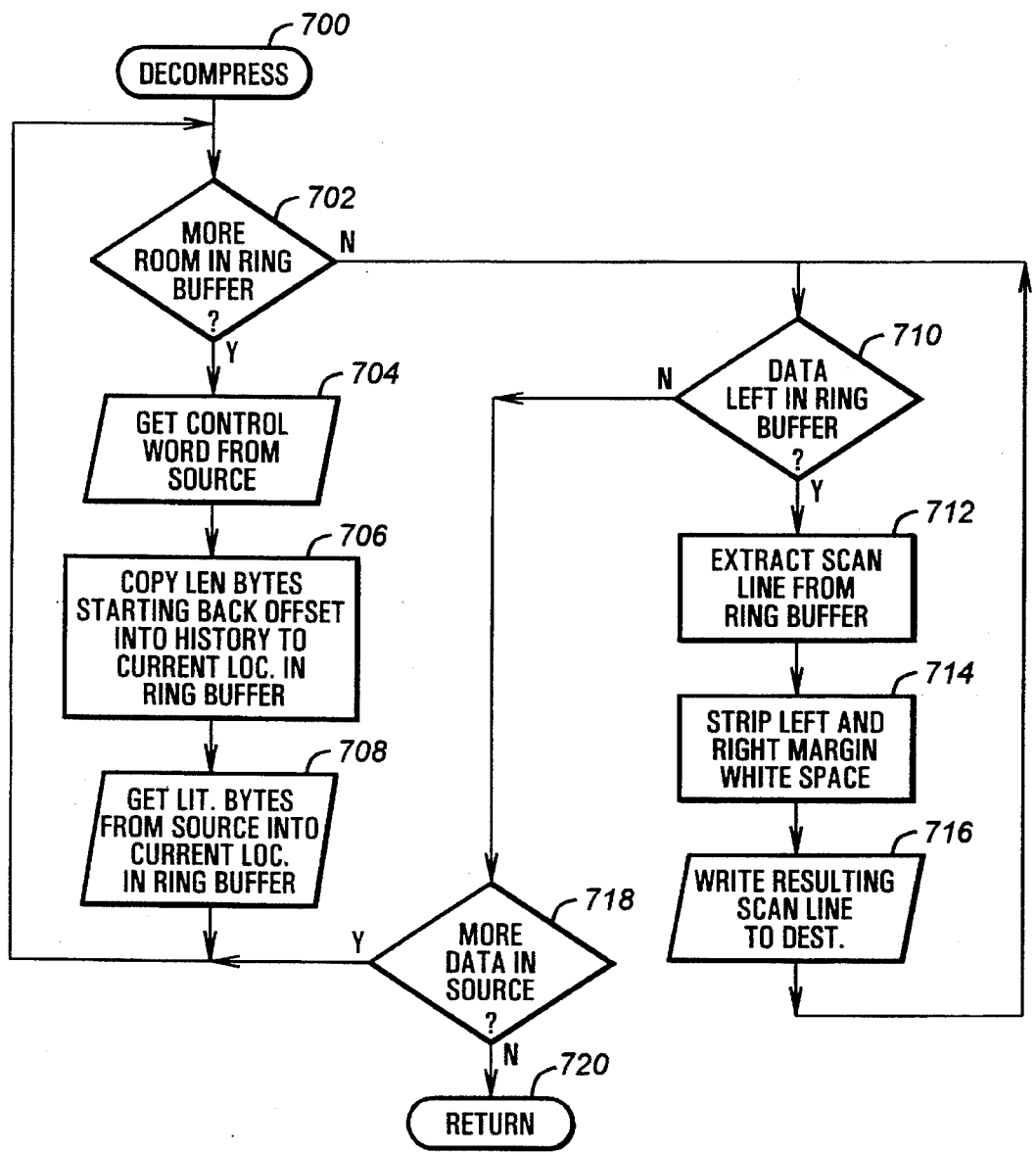
FIG. 7 shows a flow chart of a decompression routine written according to the present invention.

FIG. 7 shows a flow chart of the decompression routine 106 for decompressing a compressed bit image. The interpreter/rasterizer 100 would call this routine if the interpreter/ rasterizer 100 needed to modify a currently compressed band 208 of bit image. As with the compression routine 104, the decompression routine 106 uses the source block 400, destination block 402, and ring buffer 404, shown in FIG. 4. At step 702, the routine determines if more space remains in the ring buffer 404. If so, step 704 reads a control word from the source block 400, step 706 copies copy_cnt bytes from (put_ptr—offset_cnt) into the history of the ring buffer 404 to the current location, put_ptr, in the ring buffer 404, and then put_ptr is adjusted accordingly. This is simply a copy run. At the start of a block to decompress, this copy_cnt will be zero, as the routine has not yet built up a history in the destination block 402 from which to copy. So on the first pass through this routine, only a literal run is copied to the destination block 402. At step 708, lit_cnt bytes are read from the source block 400 to the current location, put_ptr, in the ring buffer 404, and again put_ptr is adjusted accordingly. As previously, during both the writing of data into the ring buffer 404 and the adjusting of put_ptr, it may be necessary to wrap around to the bottom end of the ring buffer 404. Similarly, in looking into the history in the ring buffer 404 for copy runs, it may be necessary to wrap around to the top end of the ring buffer 404. Finally, control passes to the top of the loop at step 702.

If step 702 finds no more room in the ring buffer 404, then a portion of the ring buffer 404 must be written to the destination block 402. So, step 710 determines if any data remains in the ring buffer 404, and if so, step 712 extracts a scan line from the ring buffer 404. This is done by reading a scan line starting from get_ptr and then adjusting get_ptr to the end of the scan line. As previously described, during both the reading of the scan line and the incrementing of get_ptr, it may be necessary to wrap around to the bottom end of the ring buffer 404. In reading data from the ring buffer 404, care must be taken not to eliminate the Lempel, as this is where the copy runs are read from in step 706. Step 714 strips the left and right margin white space from that scan line, and step 716 writes the resulting scan line sans margin white space to the destination block 402. Then control again passes to the top of the loop, step 710.

If no data remains in the ring buffer 404 at step 710, then step 718 determines if any more data remains in the source block 400. If more data remains in the source block 400, then the loop is again executed starting with step 702. At this point, the destination block 402 contains an uncompressed version of the source block 400, and that uncompressed version is the same as was previously compressed by the compression routine 104. If no more data remains, step 720 returns, as the source block 400 has been decompressed into the destination block 402.

While the interpreter/rasterizer 100 executes the decompression routine 106 in software, the decompression engine 108 uses similar logic, but in hardware. Of course, the decompression engine 108 could be constructed from an embedded controller, in which case it also would execute the decompression routine 106, as shown in FIG. 7, using its own internal software. But, the decompression engine 108 could also be, for example, an application specific integrated circuit with the same logic embedded in hardware.

Word Mode Algorithms

The word mode compression algorithm is similar in structure to the byte mode compression algorithm except that the smallest unit of data is a 32-bit word. When used with a word-wide data path, this can result in much higher real time compression speed, although the compression ratio may suffer. The real time compression speed is improved in word mode because the compression routine 104 hashes and then attempts to generate copy runs in steps of 32 bits rather than 8 bits. That is, if the compression routine 104 hashes a 32-bit word and then finds that the hash location does not match, it copies 32 bits as a literal, rather than 8 bits, and then attempts again 32 bits deeper into the source data rather than only 8 bits. It is for the same reason, however, that the compression ratio may suffer. Because the routine only attempts to generate a copy run every 32 bits, rather than every 8 bits, the chances for a match decrease. As shown in FIG. 3, the word mode control word 302 includes fields that correspond to those in the byte mode control word 300, but in the word mode control word the word offset count 310 is now a value between 0 and 1,023, the word literal count 312 is now a value between 0 and 2,047, and the word copy count 314 is now a value between 0 and 2,047.

If both the byte and word mode algorithms are used, a signal is needed for switching between byte mode and word mode compression and vice versa. To this end, an "illegal" control word is specified by setting the copy count to the maximum possible value (255 for byte mode/2,047 for word mode). Such an illegal control word signals the compression routine 104 or the decompression routine 106 to switch between byte or word mode decompression. Which to use is specified by the value of bit 23, for example, of the illegal control word. According to the invention, either byte or word mode is initially selected, and the subsequent illegal control word can be used to switch modes.

If the decompression hardware is fast enough, the word mode control word may not be needed, as it is used to provide higher rates of decompression and compression. In such a case, the more efficient byte mode can be exclusively relied upon.

If both byte and word mode are used, the interpreter/ rasterizer 100 monitors the compression ratio being achieved by the compression routine 104. The interpreter/ rasterizer 100 compares this compression ratio with a desired compression ratio parameter. The interpreter/rasterizer 100 divides the size of the uncompressed data by the desired compression ratio parameter to determine the desired maximum size of the compressed data. At this point, the data has been divided into bands. A typical image will include a top and bottom margin of white space and usually some title or banner, all of which are easily compressed. These types of data can normally be compressed beyond the compression ratio indicated by the desired compression ratio parameter even using the word mode compression routine. The word mode compression routine, using an Am29000 processor, can typically achieve real time rates approaching 6 megabytes per second. Typically, byte mode compression yields better compression ratios, but at a 4 to 1 penalty in speed.

Whether to invoke word mode or byte mode compression can be decided in more than one way. The interpreter/ rasterizer 100 can compress each band using word mode, and then determine if the word mode compression routine achieved the desired compression ratio. If the word mode routine does not achieve the desired compression ratio, the interpreter/rasterizer 100 can then recompress that same band using byte mode. The interpreter/rasterizer 100 could also decide whether to use word or byte mode compression in another manner. The interpreter/rasterizer 100 could keep track of the overall average compression ratio being achieved in the compression of previous bands. Then, using that ratio, the interpreter/rasterizer 100 could predict whether enough room remained to store the remaining data using word mode (which achieves a lower compression ratio), or whether instead enough room did not remain, and thus the interpreter/rasterizer 100 would then invoke the byte mode compression routine.

Additional Destination Block

Figure 8:
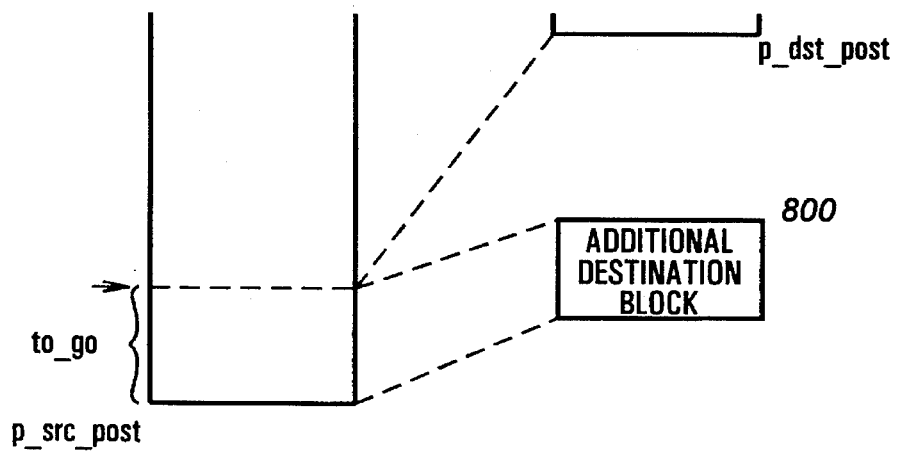
FIG. 8 illustrates how a routine would request additional destination space if written according to the present invention.

FIG. 8 illustrates how step 668 calculates the size of the needed additional destination block 900. Step 668 calculates the size of that additional destination block 900 based upon the compression ratio achieved during the compression of the source block 400 to the destination block 402 and upon the data remaining to be compressed. The length of the destination block 402 is simply p_dst_post minus p_dst_first. Similarly, as can be seen in FIG. 8, the length of the data already compressed from the source block 400 is p_src_post minus p_src_first minus to_go (the number of bytes remaining to be compressed). The compression ratio achieved in compressing data to the destination block 402 will be:

$$(p\_src\_post - p\_src\_first) - to\_go/p\_dst\_post - p\_dst\_first$$

As the compression ratio achieved in compressing the previous data should be a good indicator of the compression ratio that will be achieved with the remaining data, this compression ratio is used to determine the additional destination block 800 size needed to compress the remaining data in the source block 400. The size of the data remaining to compress is held in the variable to_go. Thus, the size of the needed additional destination block 800 is calculated to be:

$$to\_go \div (p\_src\_post - p\_src\_first) - to\_go/p\_dst\_post - p\_dst\_first$$

As can be seen in FIG. 8, the size of the additional destination block 800 is being calculated based upon the data remaining in the source block 400 and the compression ratio achieved in compressing the data to the destination block 402.

Hash Table Initialization

Figure 9:
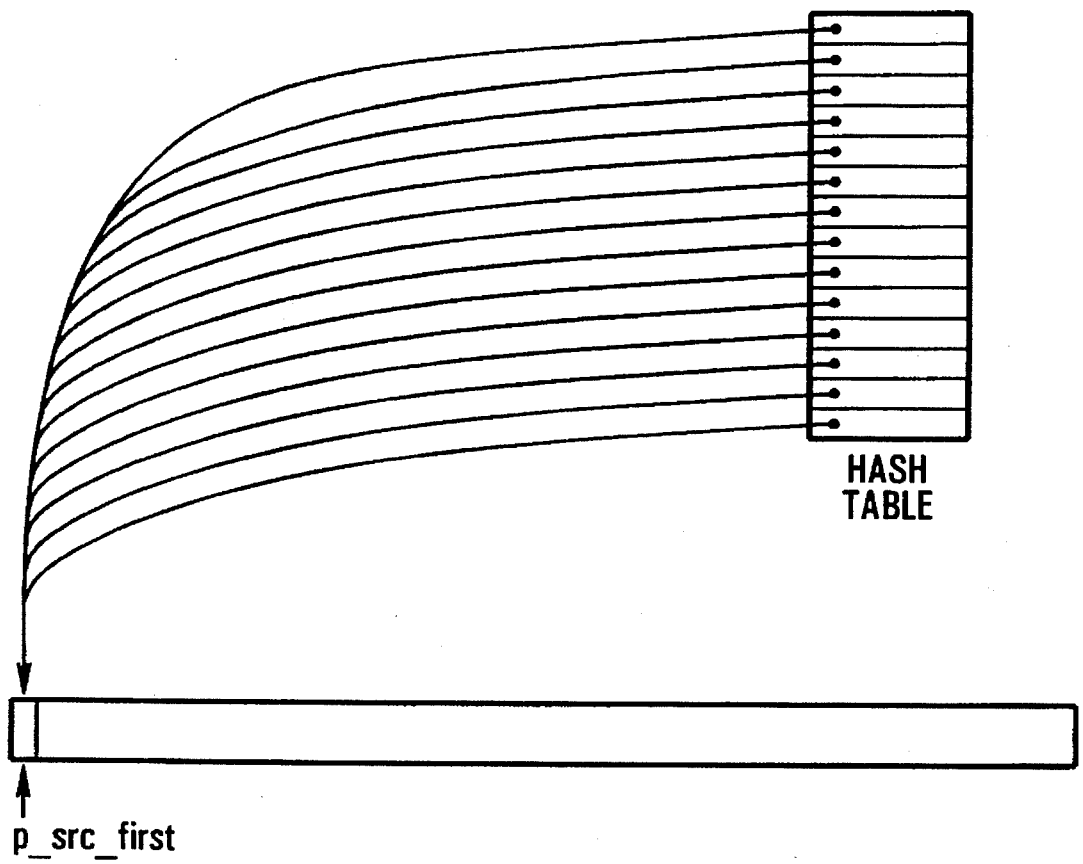
FIG. 9 shows a Lempel-Ziv 77 compression algorithm hash table initialized according to the present invention.

FIG. 9 shows a feature according to the invention represented by step 604 in FIG. 6A. FIG. 9 shows each location of the hash table loaded with the first address of the ring buffer 404. Thus, the first time a hash hit is checked, the indexed address will point to data equal to the first data in the source block 400 as modified with white space and copied to the ring buffer 404. Thus, whatever the literals used to generate the first hash index are, those literals will index to and be compared with the first bytes loaded into the ring buffer 404. This improves the chance of a hash hit, as typically the scan lines, as modified with white space, will begin with white space, or zero data. By initializing the hash table with this address, a great deal of time is saved during the beginning of the compression cycle as the most common data has already been identified.

Margin Addition

Figure 10A:
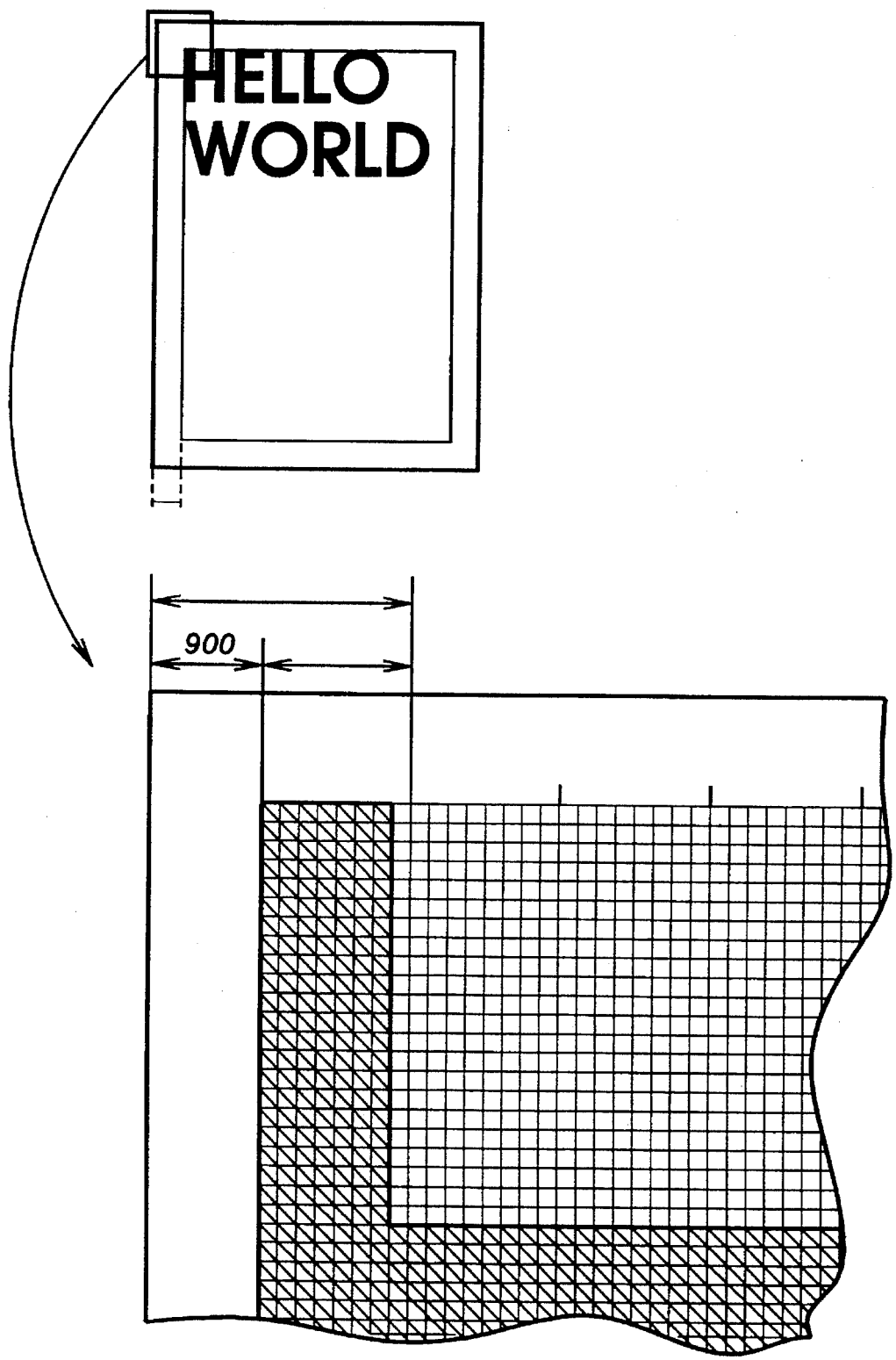
FIGS. 10A–10B illustrate margin white space added to an image according to the present invention.
Figure 10B:
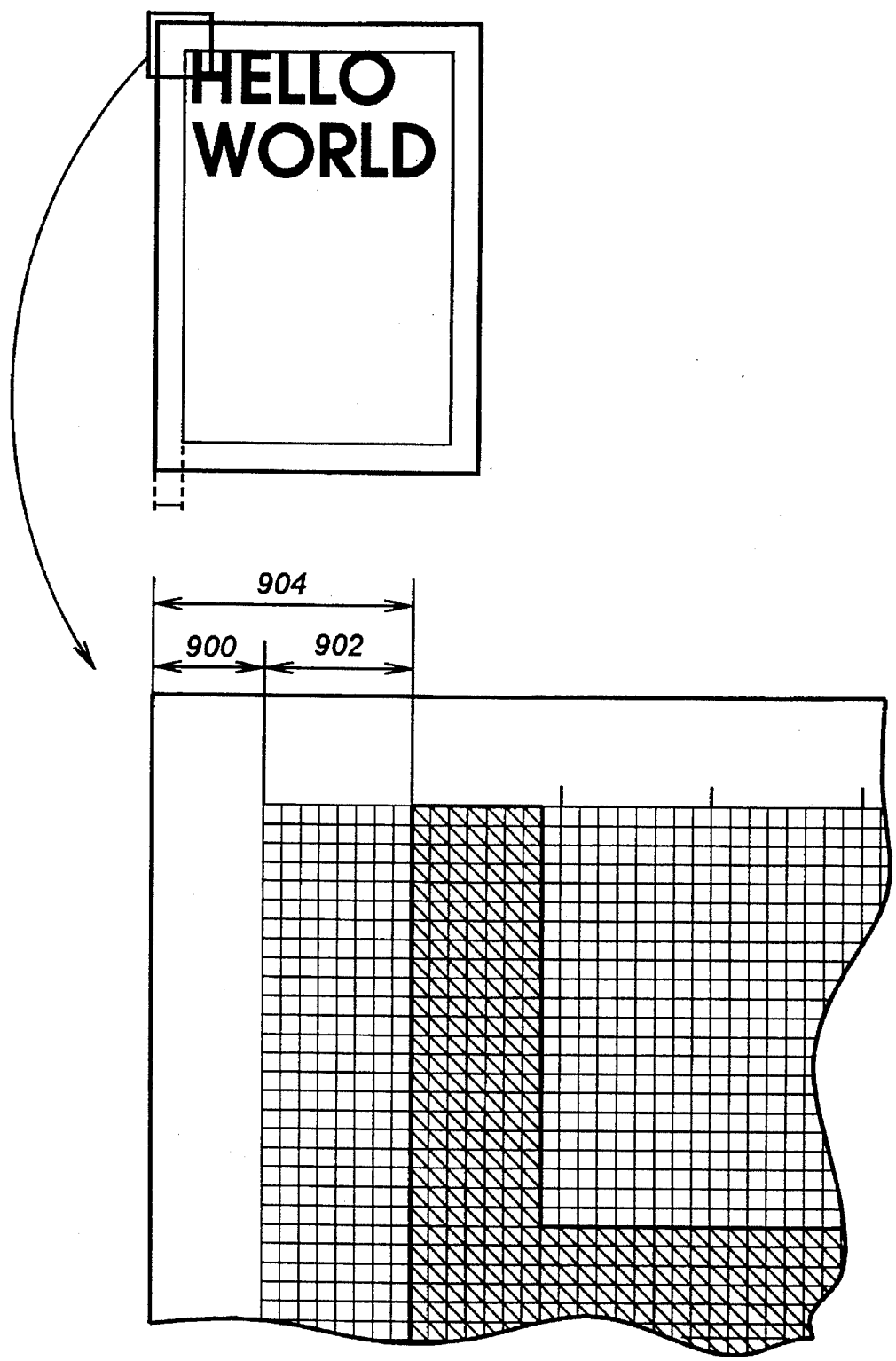

FIGS. 10A and 10B show another feature according to the invention pertaining to margin white space. These figures show the effect of adding white space to the scan lines, as is done in step 690 in FIG. 6D. FIG. 10A shows a page without white space added to the left margin, and as can be seen the only margin is a hardware necessitated margin which would typically be less than one quarter of an inch. This hardware margin 900, is set by the hardware limitations of the printer, and is simply the smallest distance from the paper edge that the print engine 110 can print data. In FIG. 10B, addition of white space to the scan line in FIG. 6D at step 690 has created an additional margin 902 which, together with the hardware margin 900, creates a total margin 904. The additional margin 902 is a software margin. Page description languages usually include commands for establishing a certain margin. When the interpreter/rasterizer 100 receives such a command, it stores the proper margin value in a variable. Thus, the size of the additional margin 902 is stored in a variable in the interpreter/rasterizer 100. In FIG. 10B, eight bits, or one byte, of additional margin 902 has been added by adding one byte of white space. In this embodiment, only multiples of four bytes are added in white space, as the optimal data size is 32 bits. This limitation is arbitrary, however, and the routine could easily be altered for other margin sizes.

Using this additional margin 902, no additional hardware is needed to implement a margin; instead, software controlled white space is added for a specified margin. Further, because this white space is not added to the source block 400 but is rather added to the data as it is inserted into the ring buffer 404, the additional white space is being added in a way that does not waste memory. The white space is simply not present in the source block 400, and in the destination block 402 it is compressed. Uncompressed white space only exists in the ring buffer 404, which only holds a limited number of scan lines.

Conclusion

To summarize how a printer designed according to this invention would operate, consider the transmission of a page from a host computer to the printer. The page consists of a series of commands in the page description language, and these commands could themselves be carried in compressed form to improve transmission time to the printer. The printer receives this serial stream of commands from the host computer, and the interpreter/rasterizer 100 then begins to interpret those commands. If the commands are in compressed form, such as is typically the case in Postscript Level 2, the interpreter/rasterizer 100 must first decompress the transmitted data. In any case, the interpreter/rasterizer then has commands with which to work. The interpreter/rasterizer 100 then begins to construct an uncompressed band 206 of the page into the uncompressed band memory 202. As it continues to receive commands from the host computer, the interpreter/rasterizer 100 completes a first uncompressed band 206, and possibly begins on a second uncompressed band 206.

When the first uncompressed band 206 is complete, the interpreter/rasterizer 100 calls the compression routine 104 to compress that first uncompressed band 206. Note that while the interpreter/rasterizer 100 is doing this compression using the compression routine 104, it can continue to receive page description language commands from the host computer and continue to construct the second uncompressed band 206 in the uncompressed band memory 202.

The compression routine 104 compresses the uncompressed band 206 and stores the result in a compressed band 208 in the compressed band memory 204. During the compression of the uncompressed bands, as previously mentioned, the compression routine 104 adds in the margin white space as specified by a variable in the interpreter/rasterizer 100. Thus, the compressed bands 208 contain compressed margin white space for decompression by the decompression engine 108. Further, the compression routine 104 of course implements all of the features of the invention previously mentioned.

If the compression routine 104 returns successfully, the interpreter/rasterizer 100 then has available to it the first uncompressed band 206 as free memory to store even a future uncompressed band of page data. Once the entire page has been received, the compressed band memory 204 contains a number of compressed bands 208 in which are stored the compressed bands of the page. If the interpreter/rasterizer 100 needs to modify one of these compressed bands, it calls the decompression routine 106 to decompress that compressed band and stores it into the uncompressed band memory 202 as an uncompressed band 206. The interpreter/rasterizer 100 can then modify that uncompressed band 206 and recompress that band using the compression routine 104.

When it is desired to print the page, each compressed band is sent directly to the decompression engine 108 in its compressed format. The decompression engine 108 then executes a hardware analogue to the decompression routine 106 and transmits decompressed scan lines to the print engine 110.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. A method of storing a bit image in a memory of a laser printer that contains the memory, an interpreter/rasterizer, and a print engine, the method comprising:

receiving a stream of page description language codes into the printer;

converting said page description language codes into a bit image by interpreting the page description language codes in the interpreter/rasterizer;

compressing said bit image into a compressed bit image whereby storage of said compressed bit image requires less memory space than storage of the bit image, yet said compressed bit image retains all of the information contained in the bit image whereby an identical copy of said bit image is extractable from said compressed bit image, the step of compressing the bit image further comprising the steps of:

initially compressing portions of the bit image using a first compression algorithm;

after said compressing using said first compression algorithm, determining if said compressed bit image that said first compression algorithm yields has a compression ratio above a predetermined limit; and if determined that said compressed bit image that said first compression algorithm yielded does not have a compression ratio greater than said predetermined limit, compressing said portions of the bit image using a second compression algorithm, wherein said second compression algorithm is computationally more complex than said first compression algorithm but said compressed portions of the bit image yielded by said second compression algorithm is smaller than said compressed bit image yielded by said first compression algorithm;

storing said compressed bit image into a specified portion of the memory;

decompressing said compressed bit image whereby said decompressed bit image is identical to the bit image that was initially compressed; and sending said decompressed bit image to the print engine.

2. A method of storing a bit image in a memory of a laser printer that contains the memory, an interpreter/rasterizer, and a print engine, the method comprising:

receiving a stream of page description language codes into the printer;

converting said page description language codes into a bit image by interpreting the page description language codes in the interpreter/rasterizer;

compressing said bit image into a compressed bit image whereby storage of said compressed bit image requires less memory compressing said bit image into a compressed bit image whereby storage of said compressed bit image requires less memory space than storage of the bit image, yet said compressed bit image retains all of the information contained in the bit image whereby an identical copy of said bit image is extractable from said compressed bit image, the step of compressing the bit image further comprising the steps of:

initially compressing portions of said bit image using a first compression algorithm;

after said compressing using said first compression algorithm, determining if said compressed bit image that said first compression algorithm yields has a compression ratio above a predetermined limit; and if determined that said compressed bit image that said first compression algorithm yielded does not have a compression ratio greater than said predetermined limit, compressing subsequent portions of the bit image using a second compression algorithm, wherein said second compression algorithm is computationally more complex then said first compression algorithm but said compressed subsequent portions of the bit image yielded by said second compression algorithm are smaller then would be compressed subsequent portions of said bit image if said subsequent portions of said bit image were compressed by said first compression algorithm;

storing said compressed bit image into a specified portion of the memory;

decompressing said compressed bit image whereby said decompressed bit image is identical to the bit image that was initially compressed; and sending said decompressed bit image to the print engine.

3. A method of storing a bit image in a memory of a laser printer that contains the memory, an interpreter/rasterizer, and a print engine, the method comprising:

receiving a stream of page description language codes into the printer;

converting said page description language codes into a bit image by interpreting the page description language codes in the interpreter/rasterizer;

compressing said bit image into a compressed bit image whereby storage of said compressed bit image requires less memory space than storage of the bit image, yet said compressed bit image retains all of the information contained in the bit image whereby an identical copy of said bit image is extractable from said compressed bit image;

storing said compressed bit image into a specified portion of the memory;

decompressing said compressed bit image whereby said decompressed bit image is identical to the bit image that was initially compressed; and sending said decompressed bit image to the print engine, wherein the step of compressing said bit image comprises the step of using a Lempel-Ziv algorithm to compress said bit image, wherein said Lempel-Ziv algorithm maintains a maximum copy count variable, wherein said Lempel-Ziv algorithm initializes said maximum copy count variable to a first predetermined value, and when said Lempel-Ziv algorithm attempts to compress data within a predetermined number of bytes from the end of the bit image, said Lempel-Ziv algorithm reduces the value of said maximum copy count variable.

4. A method of storing a bit image in a memory of a laser printer that contains the memory, an interpreter/rasterizer, and a print engine, the method comprising:

compressing a portion of a bit image stored in a source block of memory into a compressed bit image and storing said compressed bit image into a first destination block of memory, stopping said compressing when either all of said bit image has been compressed or said first destination block of memory is full, whereby storage of said compressed bit image requires less memory space than storage of the bit image, yet said compressed bit image retains all of the information contained in the bit image whereby an identical copy of the bit image is extractable from said compressed bit image: and if said first destination block of memory is full, requesting a second destination block of memory, and then performing said compressing step to compress to said second destination block of memory instead of said first destination block of memory; and repeating until the bit image in said source block is fully compressed, wherein said requesting said second destination block of memory comprises the steps of:

determining the desired size of said second destination block of memory by use of the equation $$m = (s2 \div (s1 + d1))$$

where m is the desired size of said second destination block of memory s1 is the size of that portion of said source block of memory that was compressed to said first destination block of memory d1 is the size of said first destination block of memory s2 is the size of that portion of said source block of memory that was not compressed to said first destination block of memory; and requesting said second destination block of memory of size m.

5. A laser printer comprising:

memory;

means for converting page description language codes into a bit image by interpreting the page description language codes;

a print engine;

means for receiving a stream of page description language codes into the printer and providing them to said means for converting;

means for compressing the bit image developed by said means for converting into a compressed bit image whereby storage of said compressed bit image requires less memory space than storage of the bit image, yet said compressed bit image retains all of the information contained in the bit image whereby an identical copy of the bit image is extractable from said compressed bit image, said means for compressing further comprising:

means for initially compressing portions of the bit image using a first compression algorithm;

means for determining if said compressed bit image that said first compression algorithm yields has a compression ratio above a predetermined limit; and means for compressing said portions of the bit image using a second compression algorithm if said compressed bit image that said first compression algorithm yields does not have a compression ratio above a predetermined limit, wherein said second compression algorithm is computationally more complex than said first compression algorithm but said compressed portions of the bit image yielded by said second compression algorithm is smaller than said compressed bit image yielded by said first compression algorithm;

means for storing said compressed bit image into a specified portion of the memory;

means for decompressing said compressed bit image whereby the decompressed bit image is identical to the bit image that was initially compressed; and means for sending said decompressed bit image to said print engine.

6. A laser printer comprising:

memory;

means for converting page description language codes into a bit image by interpreting the page description language codes;

a print engine;

means for receiving a stream of page description language codes into the printer and providing them to said means for converting;

means for compressing the bit image developed by said means for converting into a compressed bit image whereby storage of said compressed bit image requires less memory space than storage of the bit image, yet said compressed bit image retains all of the information contained in the bit image whereby an identical copy of the bit image is extractable from said compressed bit image, said means for compressing further comprising:

means for initially compressing portions of said bit image using a first compression algorithm;

means for determining if said compressed bit image that said first compression algorithm yields has a compression ratio above a predetermined limit; and means for compressing subsequent portions of the bit image using a second compression algorithm if said compressed bit image that said first compression algorithm yielded does not have a compression ratio greater than said predetermined limit, wherein said second compression algorithm is computationally more complex then said first compression algorithm but said compressed subsequent portions of the bit image yielded by said second compression algorithm are smaller then would be compressed subsequent portions of said bit image if said subsequent portions of said bit image were compressed by said first compression algorithm;

means for storing said compressed bit image into a specified portion of the memory;

means for decompressing said compressed bit image whereby the decompressed bit image is identical to the bit image that was initially compressed; and means for sending said decompressed bit image to said print engine.

7. A laser printer comprising:

memory;

means for converting page description language codes into a bit image by interpreting the page description language codes;

a print engine;

means for receiving a stream of page description language codes into the printer and providing them to said means for converting;

means for compressing the bit image developed by said means for converting into a compressed bit image whereby storage of said compressed bit image requires less memory space than storage of the bit image, yet said compressed bit image retains all of the information contained in the bit image whereby an identical copy of the bit image is extractable from said compressed bit image, said means for compressing further comprising:

means for using a Lempel-Ziv algorithm to compress said bit image in which said Lempel-Ziv algorithm maintains a maximum copy count variable, wherein said Lempel-Ziv algorithm comprises:

means for initializing said maximum copy count variable to a first predetermined value and for reducing the value of said maximum copy count variable when said Lempel-Ziv algorithm attempts to compress data within a predetermined number of bytes from the end of the bit image;

means for storing said compressed bit image into a specified portion of the memory;

means for decompressing said compressed bit image whereby the decompressed bit image is identical to the bit image that was initially compressed; and means for sending said decompressed bit image to said print engine.

* * * * *